US007453255B2

(12) United States Patent  (10) Patent No.: US 7,453,255 B2
Sunter et al.  (45) Date of Patent: Nov. 18, 2008

(54) CIRCUIT AND METHOD FOR MEASURING DELAY OF HIGH SPEED SIGNALS

(75) Inventors: Stephen K. Sunter, Nepean (CA); Aubin P. J. Roy, Gatineau (CA)

(73) Assignee: LogicVision, Inc., San Jose, CA (US)

( * ) Notice: Subject to any disclaimer, the term of this patent is extended or adjusted under 35 U.S.C. 154(b) by 812 days.

(21) Appl. No.: 10/991,365

(22) Filed: Nov. 19, 2004

(65) Prior Publication Data

US 2005/0111537 A1  May 26, 2005

Related U.S. Application Data

(60) Provisional application No. 60/523,323, filed on Nov. 20, 2003, provisional application No. 60/545,963, filed on Feb. 18, 2004, provisional application No. 60/558,102, filed on Apr. 1, 2004.

(51) Int. Cl.
 *G06M 1/10* (2006.01)
 *G06F 1/04* (2006.01)
(52) U.S. Cl. ............... 324/76.48; 324/76.11; 713/501
(58) Field of Classification Search ............. 324/76.48, 324/76.11; 375/226; 713/501, 503
 See application file for complete search history.

(56) References Cited

U.S. PATENT DOCUMENTS 4,695,781 A * 9/1987 Ito .......................... 318/603

| | | |
|---|---|---|
| 5,923,676 A | 7/1999 | Sunter et al. |
| 6,295,315 B1 | 9/2001 | Frisch et al. |
| 6,586,921 B1 | 7/2003 | Sunter |
| 6,687,844 B1 * | 2/2004 | Zhang ................. 713/503 |

OTHER PUBLICATIONS

Huang et al., "An On-chip Short-Time Interval Measurement Technique for testing High-Speed Communication Links", 2001 VLSI Test Symposium, Apr. 29, 2003 May 2001—Marina Del Rey, CA.
Gillis et. al., "Delay Test of Chip I/Os Using LSSD Boundary Scan", 1998 International Test Conference, Oct. 18-23, 1998, Washington, D.C. USA.

* cited by examiner

*Primary Examiner*—Vincent Q Nguyen
(74) *Attorney, Agent, or Firm*—Eugene E. Prouix; Dennis S. K. Leung

(57) ABSTRACT

A method and circuit for measuring a time interval between transitions of periodic signals at nodes of a circuit-under-test (CUT), the signals having a periodic clock frequency, the method includes periodically latching a digital value of a first periodic signal at edges of an undersampling clock, simultaneously periodically latching a digital value of a second periodic signal at edges of the undersampling clock, combining the latched digital values of the first and second periodic signals to produce a combined output whose duty cycle is proportional to the time interval between a median edge of latched digital values of the first periodic signal and a median edge of latched digital values of the second periodic signal; and counting the number of undersampling clock cycles in which the combined output is a predetermined logic value within a predetermined time interval whereat the number is proportional to a time interval between a transition of the first periodic signal and a transition of the second periodic signal.

33 Claims, 18 Drawing Sheets

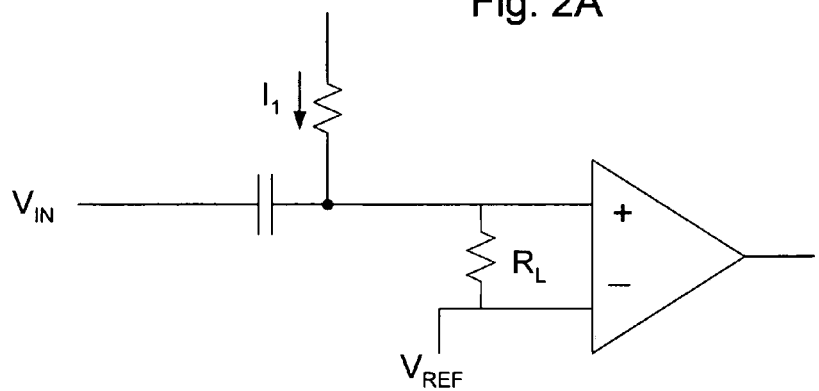
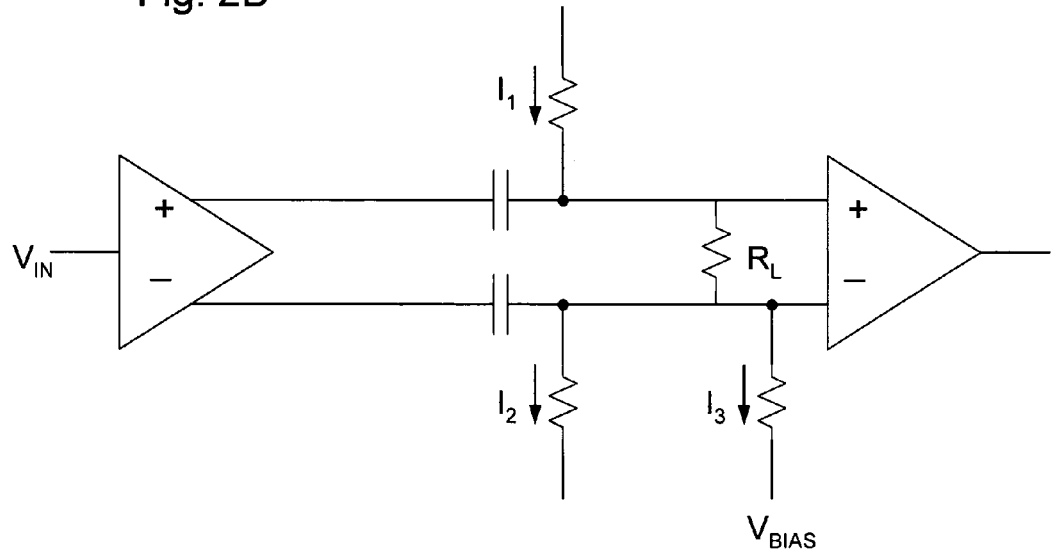

State Diagram

MedianEdge=1 during States 3, 4, 5, and 6; otherwise MedianEdge=0.
En=1 (Enable) and Rs=0 (Reset) except where indicated otherwise.
Counter output returns to zero after reaching its maximum count.

Example waveforms for counter with maximum number of counts = 6 (0 to 5)

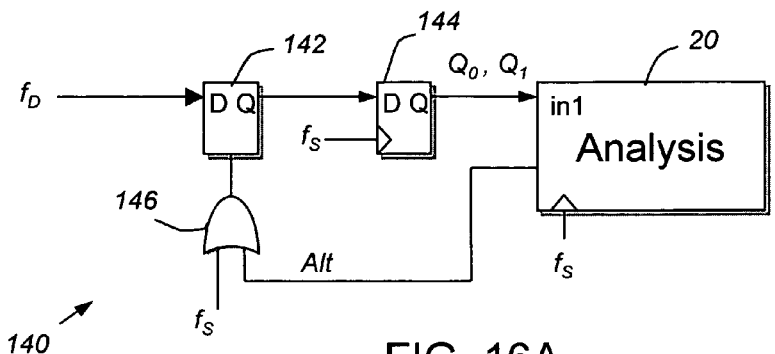
FIG. 16A
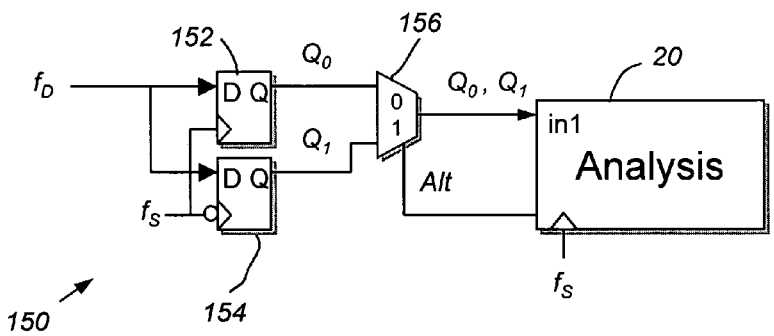
FIG. 16B
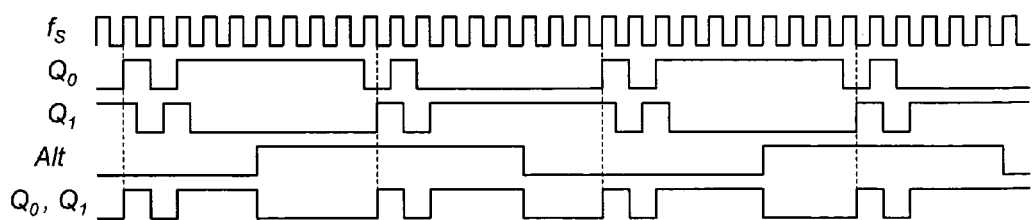

CIRCUIT AND METHOD FOR MEASURING DELAY OF HIGH SPEED SIGNALS

CROSS-REFERENCE TO RELATED APPLICATIONS

This application claims the benefit of U.S. Provisional Patent Application Ser. Nos. 60/523,323 filed Nov. 20, 2003, 60/545,963 filed Feb. 18, 2004 and 60/558,102 filed Apr. 1, 2004, all incorporated herein by reference.

BACKGROUND OF THE INVENTION

1. Field of the Invention

The present invention relates to test and measurement of signals and circuits.

2. Description of Related Art

Propagation delays and transition times of signals in integrated circuits (ICs) are targets of many specifications and tests. As these delays and times continue to decrease to the picosecond realm, measuring them is more difficult due to limits of physics, and accuracy is more important because inaccuracy can greatly affect test yield.

Rise and fall times are typically specified as shown in FIG. 1 at specific voltage thresholds, and for very high speed data signals, the duration relative to the bit duration or unit interval (UI) is most important.

Circuits for measuring signal transitions at specific voltage thresholds typically involve two comparators, but it is also possible to use a single comparator and to adjust the threshold voltage, though this can change the delay through the comparator. Alternatively, the signal can be AC-coupled to the comparator and the signal's bias voltage changed relative to a constant comparator reference voltage as shown in FIG. 2A and FIG. 2B.

Applicant's U.S. patent application Ser. No. 10/947,189 filed on Sep. 23, 2004 for "Circuit and method for Measuring Jitter of High Speed Signals", incorporated herein by reference, describes and claims a circuit and method for measuring jitter in high speed digital signals wherein the signal is coherently undersampled by a latching circuit 10 clocked at a frequency that is not an integer ratio of the data rate, as shown in FIG. 3. The output signal of the latching circuit will contain unstable bits caused by jitter in the undersampled data signal. The sampling resolution as a percent of the sampled signal period is the percent offset of the sampling clock frequency (relative to an integer ratio with the sampled signal frequency). The aforementioned application also describes a median detector circuit, whose schematic, state diagram, and waveforms are shown in FIG. 4, incorporated in analysis circuit 12 (FIG. 3A) that detects the median time in a sequence of unstable bits caused by sampling a jittered signal. The application also describes how the invention could be connected to a serializer/deserializer (SerDes) circuit 14, as shown in FIG. 5, to deduce an aspect of jitter tolerance by undersampling and measuring the pulse width or duty cycle of the logical OR of the input and output signals of a clock-data recovery (CDR) circuit 16.

In a 2001 VLSI Test Symposium paper entitled, "An On-chip Short-Time Interval Measurement Technique for testing High-Speed Communication Links", J-L Huang and K-T Cheng describe a technique for measuring delays by using coherent undersampling and counting the number of sampling clock cycles from the transition of one signal's samples to the transition of the delayed signal's samples. The transitions are required to be from continuous 0's to continuous 1's, or vice versa. To ensure that, the technique requires the signal to have the RMS jitter less than or equal to 15% of the sampling resolution to ensure that measurement errors ("misfires") will occur in less than one per million tests. The sampling resolution equals T/N, where T is the period of the sampled signal, and N is the minimum number of sampling clock periods that equals an integer multiplied by T. Therefore, for 1 picosecond RMS jitter in the sampling clock or the signal being measured, the sampling resolution needs to be larger than 6 picoseconds.

Other prior art delay measurement circuits and methods have included calibrated delay lines, a ring oscillator (Applicant's U.S. Pat. No. 5,923,676, for "BIST Architecture for Measurement of Integrated Circuit Delays"), or a tuned pair of ring oscillators (Frisch et. al. U.S. Pat. No. 6,295,315, for "Jitter Measurement System and Method"). The measurement accuracy of these circuits is limited by jitter in the signals being measured or by jitter in the measurement circuitry itself, and by the basic resolution (minimum delay step in the measurement circuitry). The best reported basic resolution is a few picoseconds, but this resolution is typically overwhelmed by the measurement circuit's self-jitter (typically more than 10 picoseconds RMS for built-in self-test circuitry, and typically more than 2 picoseconds RMS for external test circuitry). Each of these various techniques can measure only one delay at a time.

Some prior art circuit and methods measure delays and transition times of an IC's input/output (I/O) pins. Applicant's U.S. Pat. No. 6,586,921, for "Method and Circuit for Testing DC Parameters of Circuit Input and Output Nodes", describes a technique that measures I/O pin delays that are longer than a few clock periods and caused by leakage currents across intrinsic node capacitance or caused by drive currents across intentionally-added external capacitance. Aforementioned U.S. Pat. No. 5,923,676 describes a delay measurement circuit that can be used to measure I/O pin delays. In a 1998 International Test Conference paper entitled, "Delay Test of Chip I/Os Using LSSD Boundary Scan" Gillis et. al. describe a technique in which an external tester accurately applies a launch pulse on one clock input pin and applies a capture pulse on another clock input pin of the IC under test, and by adjusting the interval between the two pulses can deduce the path delay between the IC's launching register output and the capturing register input. Special circuitry is added to on-chip boundary scan circuitry at each I/O pin of the IC. All of these prior art techniques can measure the delay of only one pin at a time.

SUMMARY OF THE INVENTION

An objective of the invention is to measure the performance of circuitry for purposes of characterization, design validation, or to test whether the circuitry is free of manufacturing defects.

A further objective of the present invention is to measure signal propagation delays that may be much less than a clock period, for clock frequencies that may be multiple gigahertz and hence require picosecond measurement accuracy, and in the presence of clock jitter that is comparable to the delay measurement accuracy needed.

It is a further objective to measure time intervals that indicate the jitter tolerance of a receiver for gigahertz data-rate signals.

Another objective of the present invention is to simultaneously measure the propagation delays, or transition times, for many I/O pins of an IC.

The method and analysis circuit of the present invention measure a delay of a CUT by applying a periodic signal having a periodic pattern and coherently undersampling the input and output signals of the CUT using two latching circuits clocked at the undersampling frequency $f_S$. The frequencies are chosen so that the ratio of the undersampling frequency to the periodic signal frequency, $f_D/f_S$, is approximately equal to N±R, where N is an integer greater than one, and R is less than one and slightly greater than zero.

An average signal propagation delay of the CUT is computed based on the number of logic ones of a logic combination of the two latching circuit outputs in a predetermined time interval. The predetermined time interval is preferably an integer number of cycles of the aliased periodic pattern. A median detector circuit is employed if the two latched outputs to be compared are not similar and overlapping waveforms.

One application of the invention measures parameters that affect jitter tolerance of a CDR circuit. The average time interval between received data transition times and the CDR sampling times is measured (using the example circuit shown in FIG. 7). An alternative implementation for measuring the same time interval, without connecting to the serial data signal (an example circuit is shown in FIG. 8), measures the delay by measuring $t_A$, the average time interval between a data transmitter's reference clock and a low frequency (LF) recovered clock; $t_B$, a reversed measurement of $t_A$; and $t_C$, the time interval between the receiver's reference clock and the recovered data; and calculating the value of modulo $t_{UI}(t_A$ minus $t_B$ minus $t_C)$. For CDR circuits that employ a multiphase sampling clock (a lower frequency clock is recovered from the received data and multiple phases of the clock are used to latch the received data), the time interval between at least one pair of phases is measured by comparing adjacent outputs of the deserializer (an example circuit for a 2-phase clock is shown in FIG. 10).

The CUT may be a phase-locked loop, and the delay measured corresponds to the average phase-offset.

The delay of multiple delay paths may be measured simultaneously by shifting out the simultaneously latched output data bits to a common analysis circuit constructed according to the invention, and storing and updating on-going counts for each latch output in a common memory. At the end of the measurement, each memory address contains a count that corresponds to a delay for each of multiple delay paths.

One aspect of the present invention is defined as a circuit for measuring a time interval between transitions of periodic signals at nodes of a circuit-under-test (CUT), the signal having a clock frequency $f_D$, the circuit comprising an input for an undersampling clock signal having a sampling frequency $f_S$, where $f_{D/fS}$ is equal to K±R, K is an integer, and R is a number between zero and one, a first latching circuit for periodically latching a digital value of a periodic signal at a first node of the CUT and at edges of the undersampling clock signal, a second latching circuit for periodically latching a digital value of a periodic signal at a second node of the CUT and at edges of the undersampling clock signal, the periodic signals having the same period, means for combining the first and second latching circuit outputs to produce a combined output whose duty cycle is proportional to the time interval between a median edge of the first latch output and a median edge of the second latch output, and a counter circuit for determining an average signal propagation delay based on the number of logic ones in the combined output which occur in a predetermined time interval.

Another aspect of the present invention is generally defined as a method for measuring a time interval between transitions of periodic signals at nodes of a circuit-under-test (CUT), the signals having a periodic clock frequency, the method comprising: periodically latching a digital value of a first periodic signal at edges of an undersampling clock in which the ratio of the undersampling clock frequency to the periodic clock frequency is equal to K±R, where K is an integer, and R is a number between zero and one; simultaneously periodically latching a digital value of a second periodic signal at edges of the undersampling clock, the second periodic signal having the same period as the first periodic signal; combining latched digital values of the first periodic signal and latched digital values of the second periodic signal to produce a combined output whose duty cycle is proportional to the time interval between a median edge of latched digital values of the first periodic signal and a median edge of latched digital values of the second periodic signal; and counting the number of undersampling clock cycles in which the combined output is a predetermined logic value within a predetermined time interval whereat the number is proportional to a time interval between a transition of the first periodic signal and a transition of the second periodic signal.

BRIEF DESCRIPTION OF THE DRAWINGS

These and other features of the invention will become more apparent from the following description in which reference is made to the appended drawings in which:

FIG. 2A, 2B, shows schematics of bias offset circuits that facilitate measurement of transition time for single-ended and differential signals.

FIG. 16A, 16B, is two schematics of circuits that use both edges of the sampling clock to facilitate faster timing parameter measurement, and example waveforms, according to an embodiment of the present invention.

DETAILED DESCRIPTION OF THE INVENTION

In the following detailed description, numerous specific details are set forth in order to provide a thorough understanding of the present invention, However, it will be understood by those skilled in the art that the present invention may be practiced without these specific details. In other instances, well known methods, procedures, components and circuits have not been described in detail so as not to obscure aspects of the present invention.

The present invention is based on Applicant's aforementioned Application No. 10/947,189, which is incorporated herein by reference.

In the present invention, consistent with the aforementioned application, a periodic input signal, having data that is clocked at a data frequency, $f_D$, is applied to the CUT. The input and the output of the CUT are coherently undersampled by latches clocked at a sampling frequency, $f_S$. The frequencies are chosen so that the ratio of the sampling frequency to the data frequency, i.e., $f_D/f_S$, is approximately equal to N±R, where N is an integer greater than one, and R is less than one and slightly greater than zero, for example 0.001.

Figure 5:
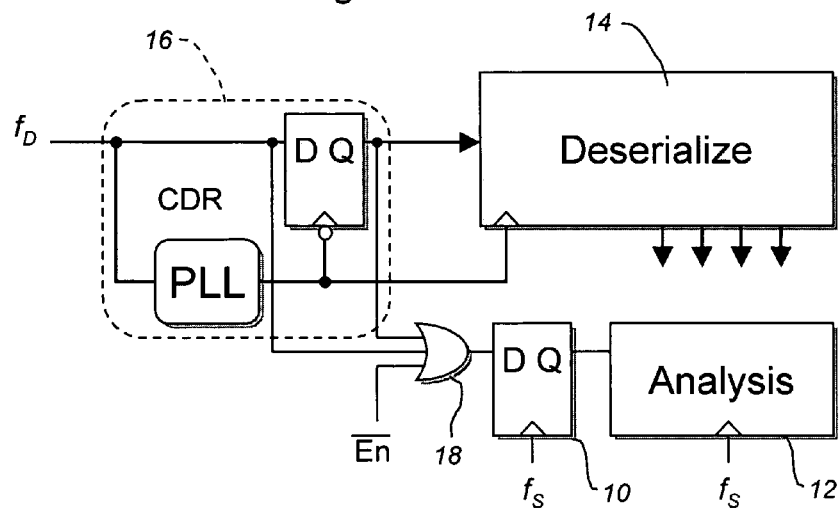
FIG. 5 is a schematic of a circuit for measuring a sampling time within a signal eye.
Figure 6A:
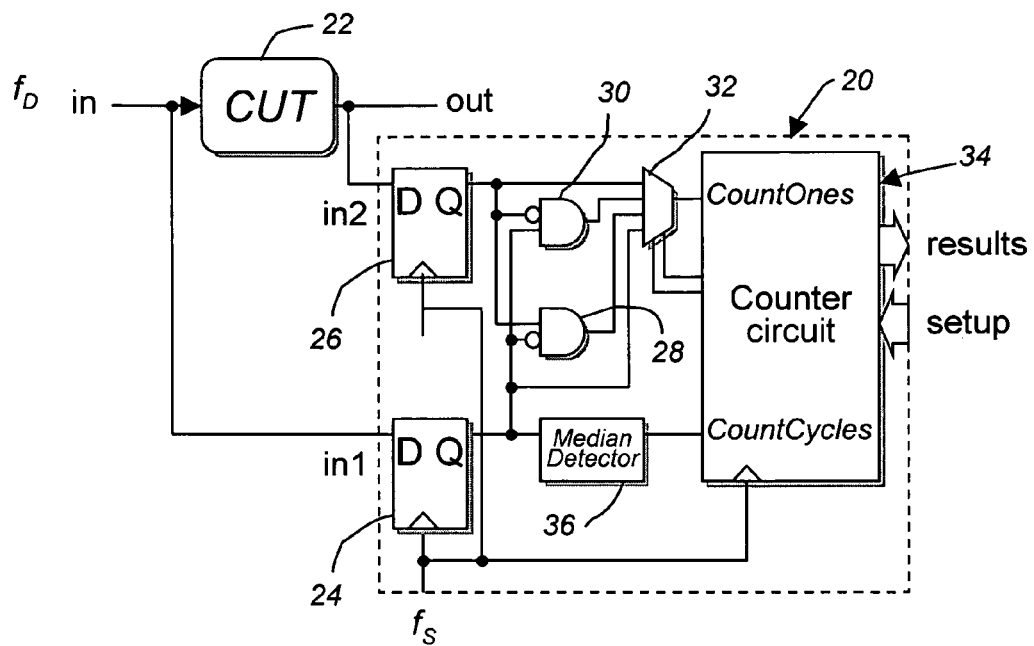
FIG. 6A, 6B, is a schematic of a circuit for measuring a time interval between an input and output of a circuit under test (CUT) according to an embodiment of the present invention.
Figure 6B:
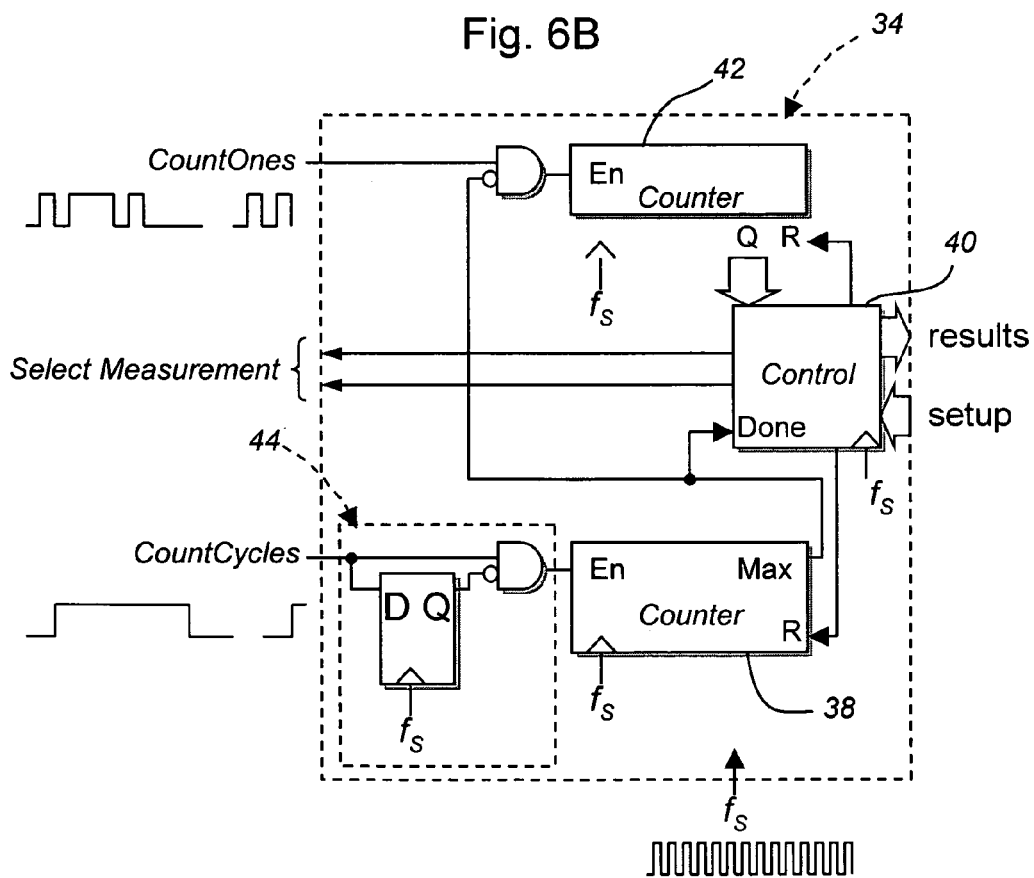

A schematic of the general circuit of the invention is shown in FIG. 6. The schematic of FIG. 6A shows an improvement of the circuit shown in FIG. 5. The circuit of FIG. 5 logically combines (using an or-gate 18, for example) the CUT input and output signals, and undersamples the resulting combination. A combinational gate operating at gigahertz frequencies is more difficult to construct and requires more power than an undersampling latch circuit. To measure the jitter on the input and output signals, according to Applicant's aforementioned application, undersampling latches need to be connected to the same nodes. In analysis circuit 20 of FIG. 6A, the input signal, in, and output signal, out, of CUT 22 are latched by latches 24 and 26, respectively, and the latch outputs are logically combined. Jitter can be measured for the same latch outputs, thereby eliminating a second connection to the input and output signal nodes required in FIG. 5. The construction of the combinational gates in FIG. 6A is much simpler because they operate at the undersampling data rate. And-gates 28 and 30 are used to combine the input signal and the inverted output signal, or vice versa, so that the delay for a rising edge and the delay for a falling edge can be measured separately (as shown in FIG. 7B), as selected via a multiplexer 32. An input periodic data pattern is chosen that has a minimum pulse width longer than the delay of the CUT. The analysis circuit includes a counter circuit 34 illustrated in detail in FIG. 6B.

For counter circuit 34, the duration of each measurement is predetermined to be a number of periods of $f_S$, or preferably a number of periods of the CUT input data pattern. To permit counting the number of CUT input signal periods, its latch output is processed by a median detector 36, constructed according to FIG. 4.

Figure 1A:
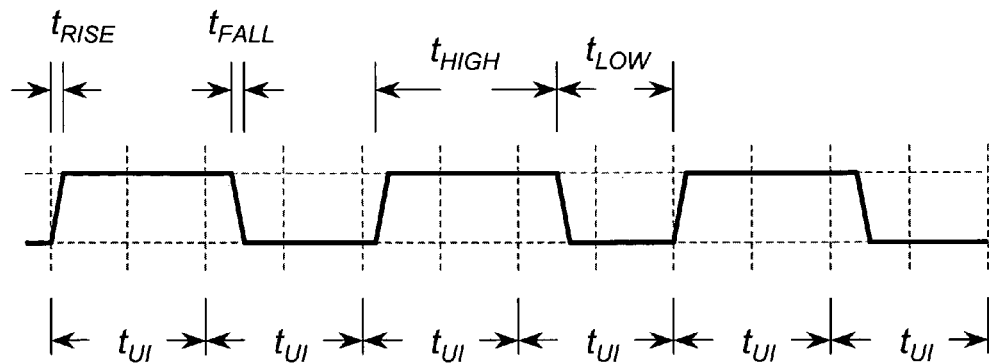
FIG. 1A, 1B, shows periodic waveforms, and their rise and fall times.
Figure 1B:
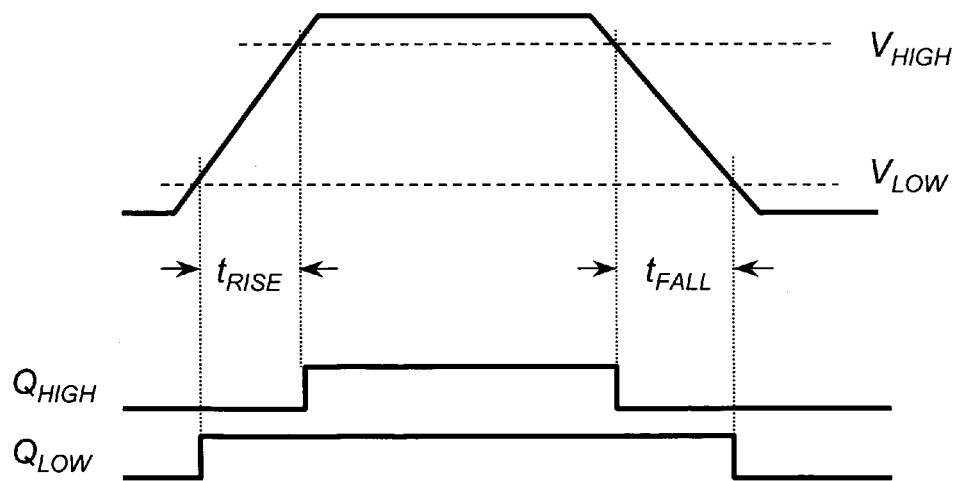
Figure 3A:
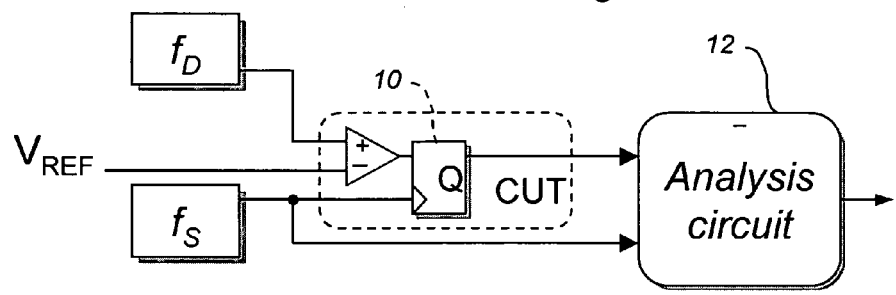
FIG. 3A, 3B, is a schematic of an undersampling circuit, and example waveforms.
Figure 3B:
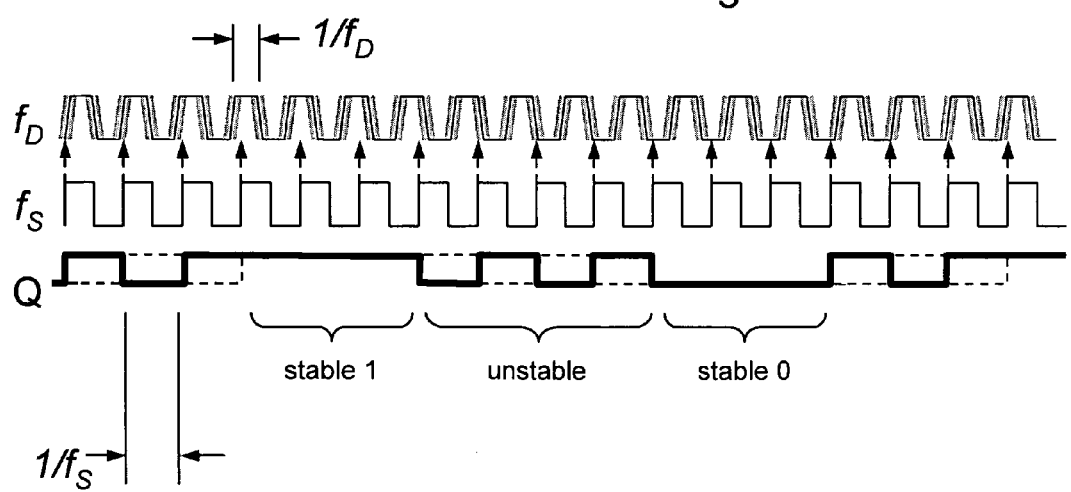
Figure 4A:
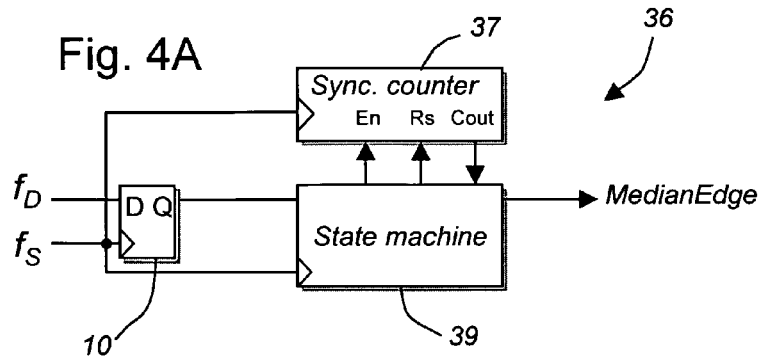
FIG. 4A, 4B, 4C, is a schematic, state diagram, and example waveforms of a median edge detector.
Figure 4B:
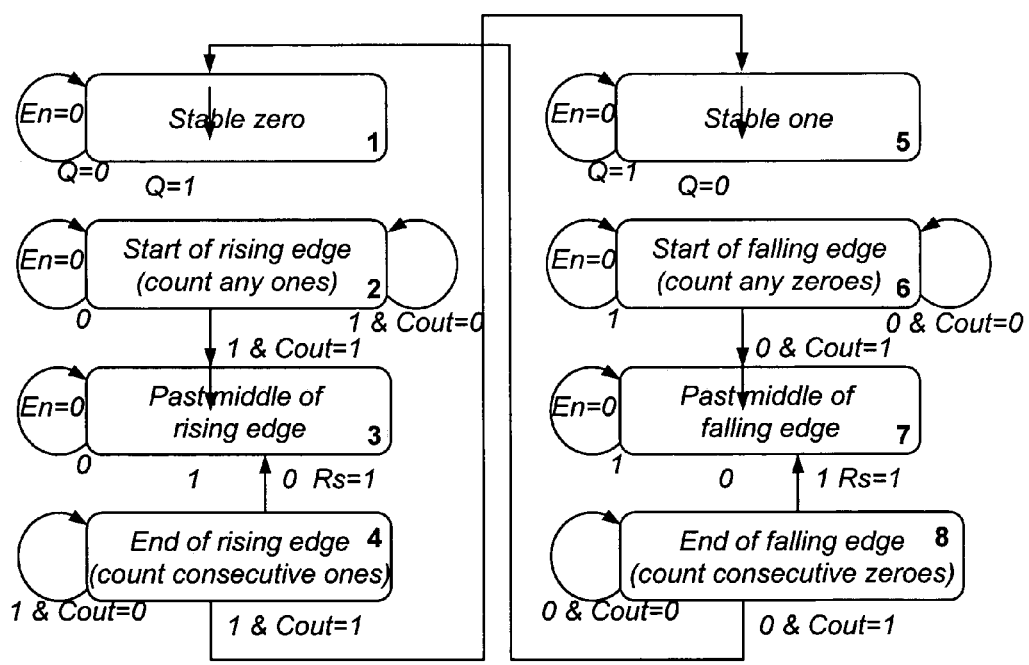
Figure 4C:
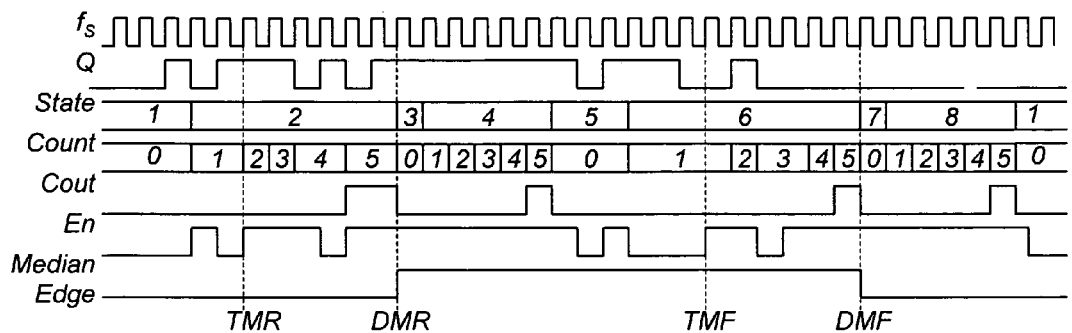

The circuit of FIG. 4A derives a "jitter-free" version of the input signal, $f_D$, that has no unstable intervals if the duration of each group of unstable bits in the latched data signal Q is less than or equal to twice the maximum number of counts of a synchronous counter 37. A state machine 39 has a state diagram shown in FIG. 4B. The inputs to the state machine are latched data signal Q of the latching circuit, a carry-out, Cout, of the synchronous counter which indicates that the counter has reached its maximum count, and sampling clock $f_S$. The outputs of the state machine are an enable signal, En, to enable the counter to count cycles of sampling signal, $f_S$, a reset signal, Rs, that resets counter 37 to its zero state, and a signal MedianEdge which rises shortly after the median of the rising of the signal Q is detected and falls shortly after the median of the falling edge of signal Q is detected, as shown in the waveforms of FIG. 4C. In the FIG. 4C waveforms, the true median rising edge is indicated by TMR, the output delayed median rising edge is indicated by DMR (delayed by the short interval), and likewise TMF and DMF for the falling edges. The unstable regions are shaded in the Q waveform for clarity.

The waveforms in FIG. 4C are for a counter 37 whose maximum number of counts is 6. The waveforms show an unstable region for the rising edge that is 8 cycles long. For the output median edge signal to have the same period as that of signal Q, the duration of stable bits must be at least equal to the maximum number of counts of the synchronous counter, and the total number of logic 1's between the median rising edge and median falling edge (and logic 0's between the median falling edge and median rising edge) must be at least equal to twice the maximum number of counts of the synchronous counter. The waveforms in FIG. 4C show a stable 1 region that is only 8 cycles long, but there are fourteen 1's between medians.

The output of the median detector is free of any unstable bits caused by jitter and is a CountCycles input to a first counter 38. Circuit 44 detects rising edges (or falling edges) of the CountCycles signal and enables incrementing of counter 38 each time an edge is detected. Alternatively, the counter is enabled continuously (not shown, for simplicity) so that the counter counts periods of sampling clock $f_S$. A second counter circuit 42 counts the number of $f_S$ clock cycles during which the CountOnes signal is logic 1 until the CountCycles counter reaches its predetermined maximum count. When the maximum count is reached, the measurement is done, and the CountOnes counter's output count is the measurement result. The result can be converted into units of time by dividing the count by the predetermined number of periods and then multiplying by R times the period of $f_D$. The analysis circuit shown in FIG. 6A, can measure various signal properties. The following measurements assume that $f_D=f_S(K+R)$, which causes the latched outputs to correspond to positive time. If $f_p=f_S(K-R)$, then the latched outputs correspond to negative time causing the signals to be inverted. The multiplexer selection is controlled by the data transferred into the control circuit during setup.

a) If the multiplexer selects the in2 latch, then the number of ones counted is proportional to the duty cycle, or the average pulse width, of the CUT output signal.

b) If the multiplexer selects the first and-gate, the falling edge propagation delay of the CUT is measured—this is the time while the in signal is logic 0 and the out signal is still logic 1.

c) If the multiplexer selects the second and-gate, the rising edge propagation delay of the CUT is measured—this is the time while the in signal is logic 1 and the out signal is still logic 0.

d) If the multiplexer selects the in1 latch, then the number of ones counted is proportional to the duty cycle, or the average pulse width, of the CUT input signal.

The CUT 22 shown in FIG. 6A could be an analog or digital circuit. In either case, the data input to each latching circuit is the result of a comparison between the input signal and a DC reference voltage, and a DC voltage offset may be added to the signal prior to the comparison. The voltages may be single-ended or differential. The DC reference voltage could be the intrinsic switching point voltage of a logic gate, the common mode voltage of a differential signal, or an adjustable reference voltage of a comparator. The DC voltage offset may be added as shown in FIG. 2.

The CUT shown in FIG. 6A could also be a phase-locked loop (PLL), and, in this case, the measured delay will be equal to the average phase offset of the PLL. The output frequency of the PLL is preferably equal to the input frequency—a synchronous counter can be used, if necessary, to create an equal frequency output. The edges of the output signal of a PLL may be advanced or delayed, on average, relative to the edges of the input reference clock signal. The phase error must be measured in close proximity to the PLL to ensure that the delays of the access paths are insignificant. The analysis circuitry 20 shown in FIG. 6A can be placed very close to the PLL under test because the critical time path circuitry only comprises two latching circuits (or one latching circuit and a multiplexer, as described later for FIG. 11B). The measured time interval could be positive or negative, indicating a positive or negative average phase error. The reference clock can be a clock, a periodic data sequence, or a random data sequence with a constant value pair of bits (logic 0 followed by logic 1, or vice versa) inserted at a periodic interval. The same access circuit can be used to measure the PLL output signal's duty cycle, as previously described.

Figure 7A:
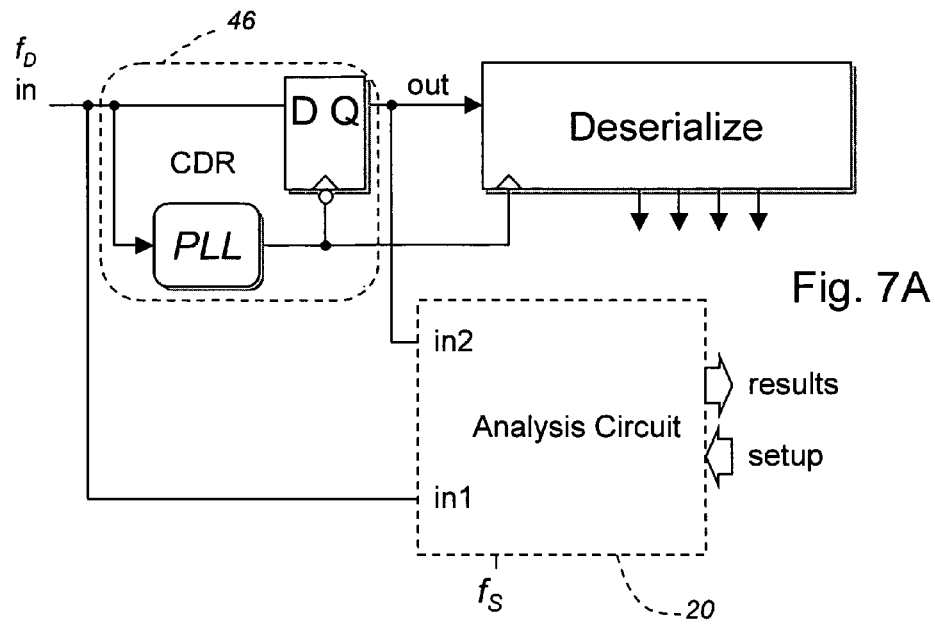
FIG. 7A, 7B, is a schematic of a circuit for measuring a time interval between an input and output of a digital receiver, and example waveforms, according to an embodiment of the present invention.
Figure 7B:
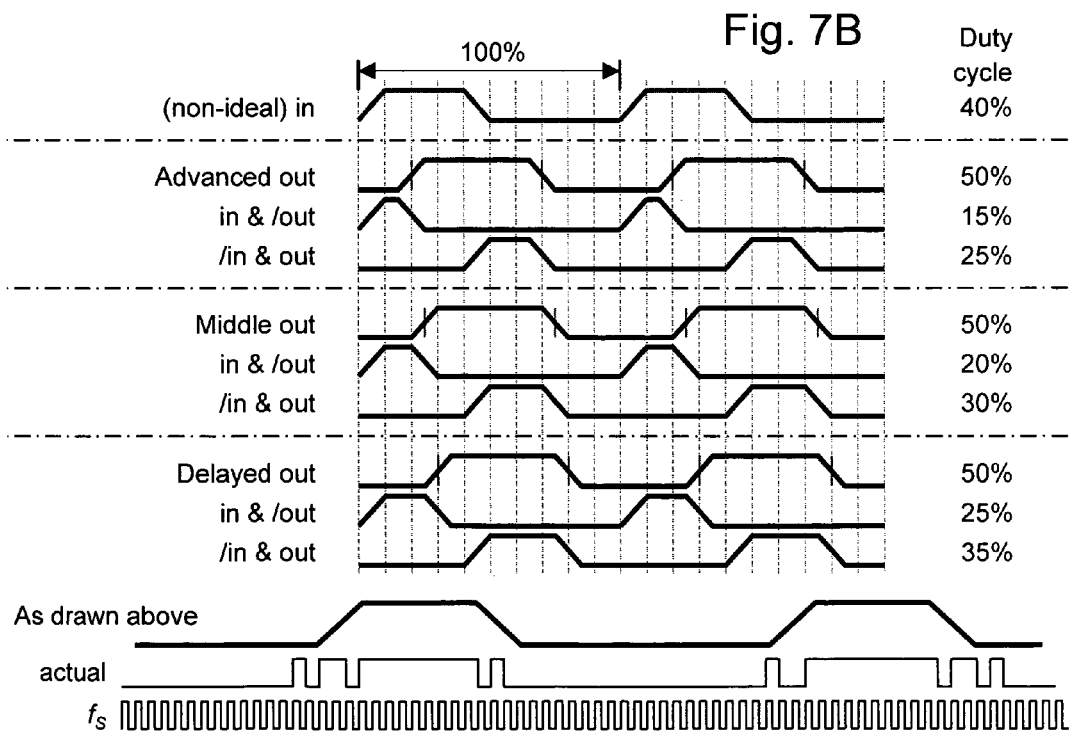

The circuit schematic of FIG. 7A shows how analysis circuit 20 can be connected to a CDR 46 (that has no reference clock input) to measure the CDR sampling delay: when the received data is sampled, relative to the received data signal, i.e., the location of the sampling instant in the received signal eye, is an indicator of jitter tolerance. The input signal to the CDR is preferably the output signal of any signal buffers and equalization circuitry in a receiver that uses the CDR. The corresponding waveforms shown in FIG. 7B show example latch outputs for the in and out signals, and the and-gate outputs, for different amounts of PLL phase-offset: phase advanced, middle phase, and phase delayed. The duty cycles that would be measured are also shown. A non-ideal example input waveform is shown—a 1010 data pattern in which the duty cycle is not 50%. The waveforms are shown as trapezoidal shapes, but in reality, the waveforms will have unstable bits caused by jitter in the undersampled signals—a more realistic, but simplified waveform, is shown in the "actual" waveform. For the "middle" output timing, the two measured duty cycles are 20% and 30%—ideally their sum is 50% and each should be 25%. If the sum is larger than 50%, the sampling point is delayed within the data signal eye, and if the sum is less than 50%, the sampling point is advanced within the data signal eye. Unequal duty cycles indicates deterministic jitter.

Figure 8A:
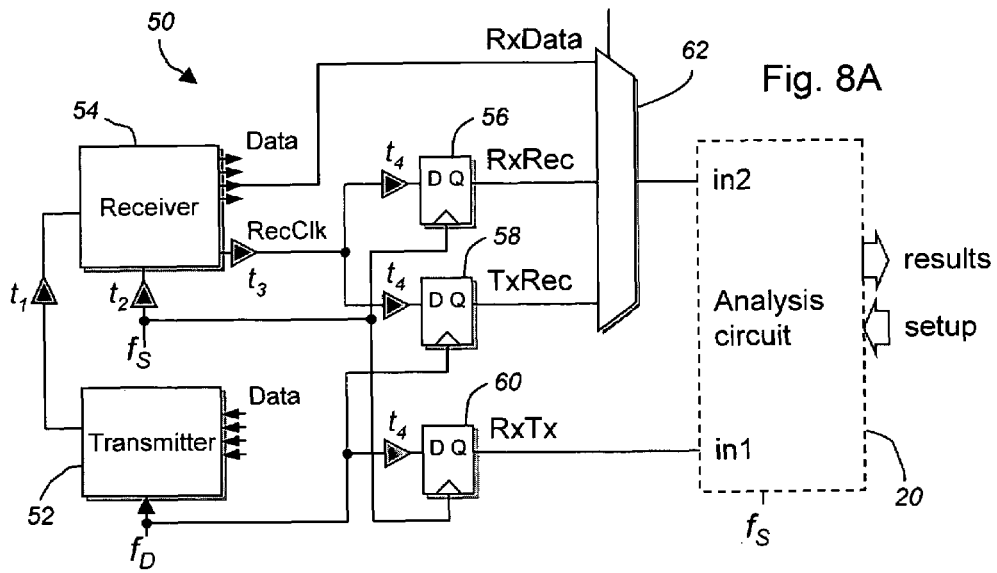
FIG. 8A, 8B, is a schematic of a circuit for measuring a time interval between an input and output of a digital transmitter and receiver, and example waveforms, according to an embodiment of the present invention.

The CDR connections shown in FIG. 7A are suitable for any CDR; however, connections to gigahertz signals may require unacceptably fast circuitry that consumes unacceptable power and affects the signal being measured. The circuit schematic of FIG. 8A shows alternative connections: only relatively low frequency outputs of the receiver are connected to the analysis circuit, however the receiver must be one that uses a reference clock input, like the conventional receiver shown in FIG. 9. It may be more practical to add a reference clock input to a CDR than to add undersampling latches. With these alternative connections, the undersampling latch is now the receiver's function mode latch.

The following paragraphs describe how the circuit 50 of FIG. 8 measures the CDR sampling delay (without requiring undersampling latches connected to the CDR).

The various unknown delays in the transmitter 52 and receiver 54 of FIG. 8A are represented as explicit delays $t_1$, $t_2$, $t_3$, and $t_4$. The circuit assumes and requires that the three latches 56, 58 and 60 have substantially equal $t_4$ delays (and setup and hold times)—this can be achieved by placing the three latches shown in FIG. 8A in close physical proximity with wire-only connections (no buffers). First latch 56, with output RxRec, is clocked by $f_S$ and latches the recovered clock signal. Second latch 58, with output TxRec, is clocked by $f_D$ and also latches the recovered clock signal. Third latch 60, with output RxTx, is clocked by $f_S$ and latches $f_D$.

The following delay explanations are given to help explain the CDR sampling delay measurements, but they are not definitive—other explanations could be used to achieve the same result.

$t_1$ is the total delay from the $f_D$ reference clock input to the receiver's latch data input, minus the delay from the reference clock to the sampling latches' clock or data input.

$t_2$ is the total delay from the $f_S$ reference clock input to the receiver's latch data input, minus the delay from the reference clock to the sampling latches' clock input.

$t_3$ is the total delay from the receiver's latch clock input to the parallel data rate recovered clock output.

$t_4$ is the apparent delay difference between each latch's data and clock inputs.

Figure 8B:
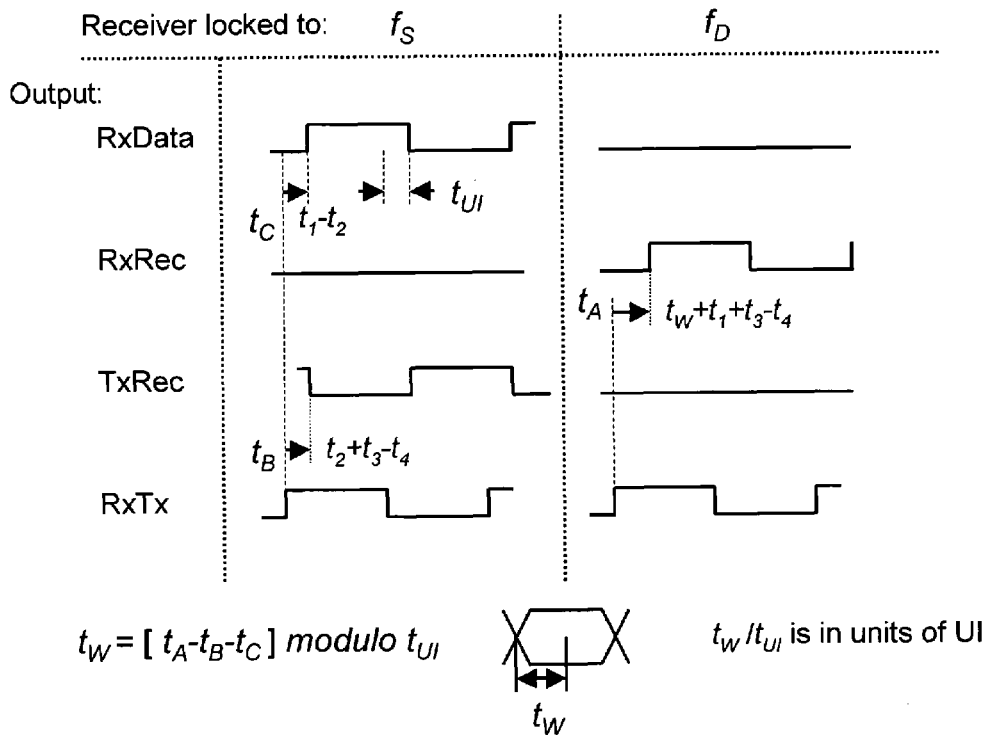

The waveforms of FIG. 8B show example outputs when the receiver CDR is locked to its reference clock having frequency $f_S$, and when the receiver is locked to the incoming serial data from a transmitter that is locked to reference clock having frequency $f_D$. A multiplexer 62 selects which signal is used for each intermediate measurement. While the CDR is locked to $f_S$, and the transmitter transmits a data pattern that is logic 1 for the first half of the undersampling period and logic 0 for the second half, the analysis circuit measures delay $t_B$ between the rising edge of signal RxTx and the falling edge of signal TxRec (alternatively, the delay from rising edge to rising edge is measured if it can be expected to differ by an integer number of UI). Delay $t_C$ between the rising edge of signal RxTx and the rising (or falling) edge of signal RxData, one of the parallel outputs from the receiver, is also measured. While the CDR is locked to the transmitted data, the analysis circuit measures the delay $t_A$ between the rising edge of signal RxTx and the rising edge of signal RxRec. The CDR sampling delay, $t_W$, will be equal to $t_A$ minus $t_B$ minus $t_C$, modulo $t_{UI}$, where $t_{UI}$ is the count that corresponds to the unit interval (1 UI). For example, if $t_A$ count equals 310, $t_B$ count equals 220, $t_C$ count equals 250, and $t_{UI}$ equals 100, then $t_A$-$t_B$-$t_C$=−

160, and −160 modulo 100 equals 40. Therefore the sampling point $t_{W}$ is 40% of the UI after a rising (or falling, respectively) received data edge.

The arrival time of received data transitions for gigahertz signals traveling over wire is frequency dependent and hence depends on the number of transitions per unit time. Receiver equalization circuitry can compensate for this. The actual data arrival time at the latching circuit can therefore measure the amount of frequency dependence and equalization. FIG. 8B shows a received waveform with a minimal number of transitions per unit time. While measuring $t_A$, it is possible to repeat the measurement with transmitted patterns containing more transitions to measure the change in arrival time.

Figure 9:
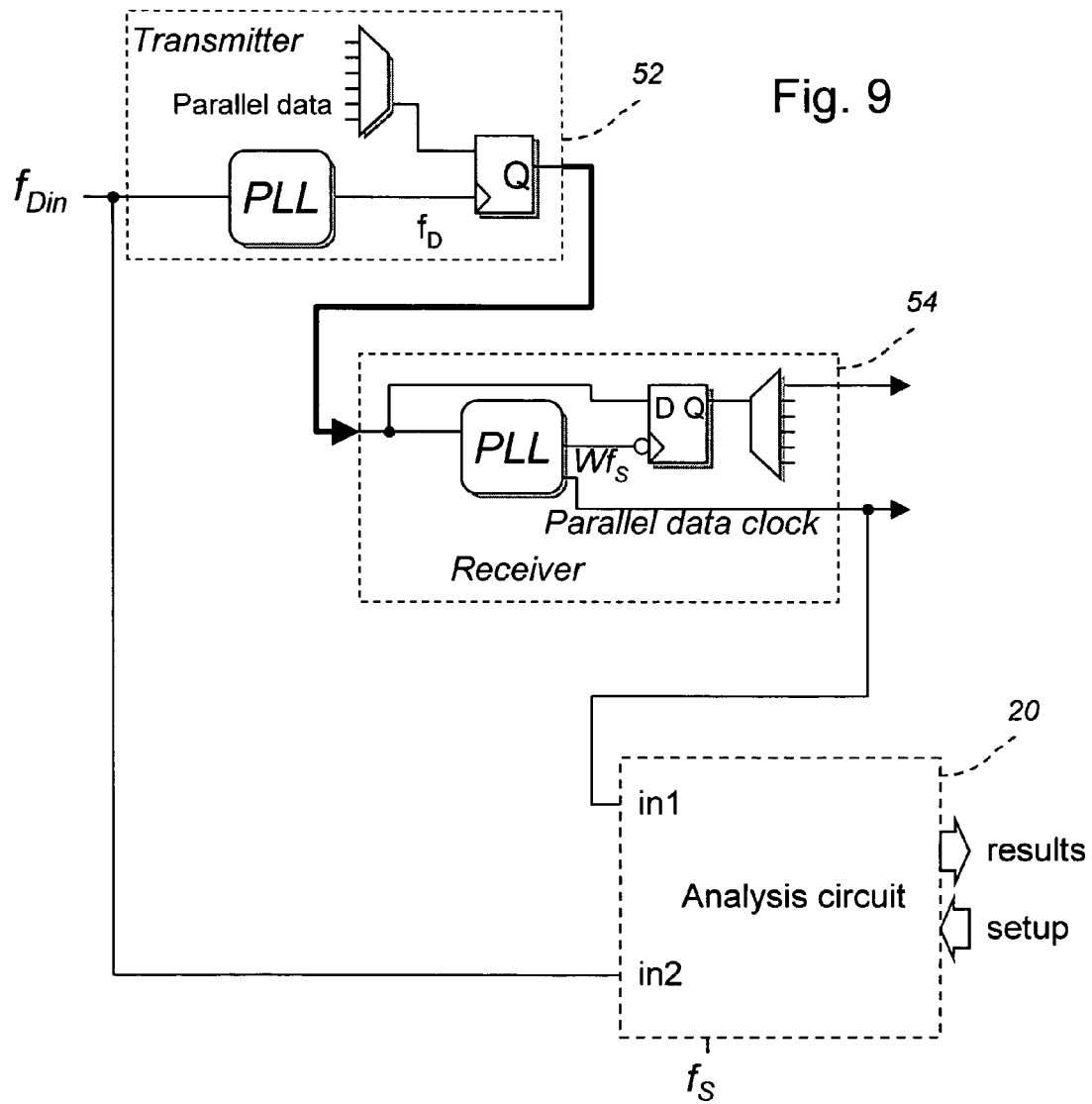
FIG. 9 is a schematic of a circuit for measuring a time interval between an input and output clock of a digital transmitter and receiver according to an embodiment of the present invention.

FIG. 9 shows a schematic of a circuit that is a simpler implementation than the circuit in FIG. 8A. The circuit of FIG. 9 does not require a reference clock input to the receiver, but can measure the difference in actual data arrival time for different transmitted patterns. According to the invention, while transmitting a pattern with a number of transitions per unit time, the delay of the recovered parallel data rate clock is measured with the analysis circuit. A different pattern is then transmitted with a different number of transitions per unit time, and the delay of the recovered parallel data rate clock is measured again. The difference in the two measured delays is proportional to the difference in actual data arrival time as previously defined.

Figure 10:
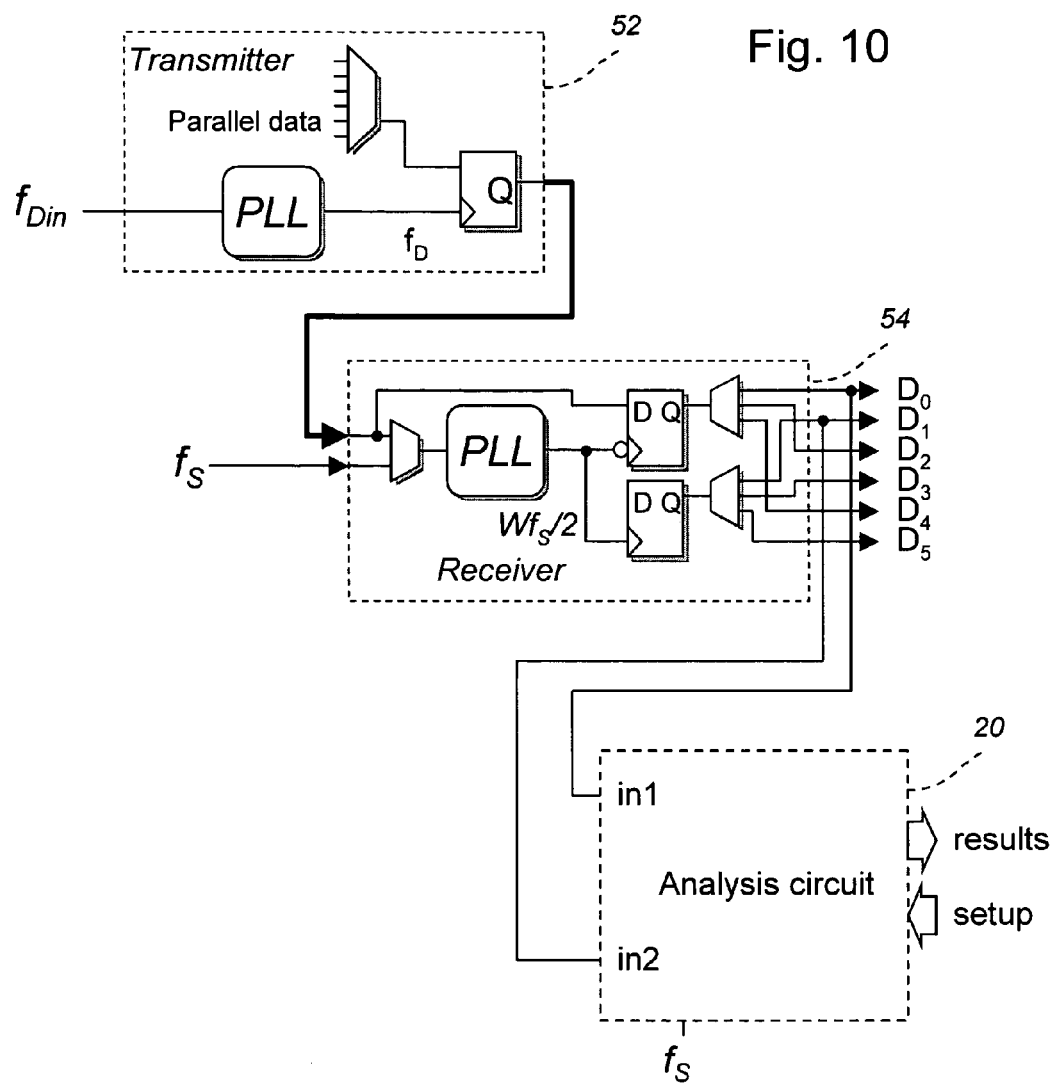
FIG. 10 is a schematic of a circuit for measuring a time interval between sampling phases of a digital receiver according to an embodiment of the present invention.

Some CDR circuits employ a multi-phase sampling clock so that a lower frequency clock is recovered from the received data and multiple phases of the clock are used to latch the received data. The lower clock frequency reduces power consumption significantly, however any deviations in the average clock phases from their ideal value will cause variation in the apparent sampling instants of the receiver, which is equivalent to jitter. According to an embodiment of the present invention, the actual time interval between the sampling phases can be measured directly using the connections shown in the schematic of FIG. 10. The receiver shows an example equivalent circuit for a deserializer to show how a two-phase sampling clock produces parallel data outputs in which adjacent bits are derived from different sampling phases—the time interval between a pair of phases is measured by comparing any two adjacent outputs of the deserializer, for example $D_0$ and $D_1$ as shown in FIG. 10. If four-phase sampling is used (to permit the PLL to operate at one quarter the data frequency), then four adjacent output pairs need to be measured, for example $D_0$-$D_1$, $D_1$-$D_2$, $D_2$-$D_3$, and $D_3$-$D_0$. The last pair is not strictly adjacent, and not strictly necessary because all four delays must add to a constant, but is a useful check for measurement consistency.

In the cited prior art delay measurement technique by Huang and Cheng, jitter is stated to be a fundamental limitation to the accuracy and resolution of the technique, and the authors set limits on the maximum tolerable jitter for a given delay measurement accuracy. Using the combinational logic of the present invention, this limitation is overcome—almost any amount of jitter can be tolerated. If the frequencies $f_S$ and $f_D$ are generated from a single reference frequency, by using a PLL as required by Huang and Cheng, the CountCycles input to the counter circuit can simply be this single reference frequency divided by an appropriate integer. If the frequencies $f_S$ and $f_D$ are not generated from a single reference frequency, then the present invention's median edge detector provides additional advantages—an integer number of pattern cycles can be averaged even when substantial jitter is present in either signal and an equivalent single reference frequency can be generated by undersampling the $f_D$ clock.

Figure 11A:
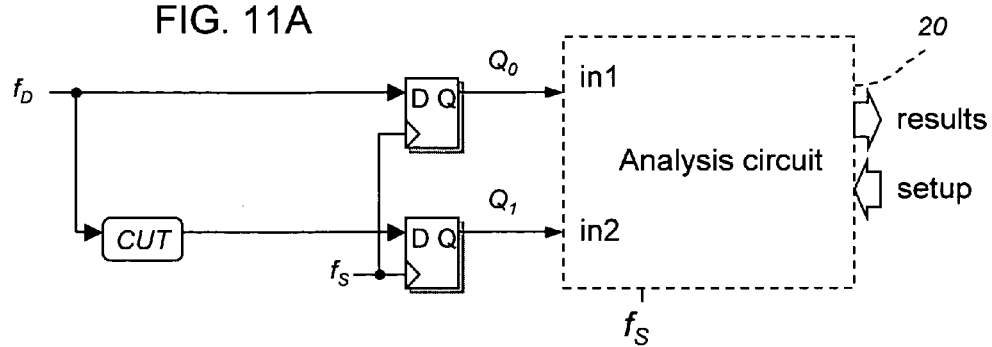
FIG. 11A is a schematic of circuit that measures time intervals.

The analysis circuit described thus far is shown again, in FIG. 11A, with additional flip-flops to show that any number of flip-flops can be added, as long as an equal number is added to each path.

Figure 11B:
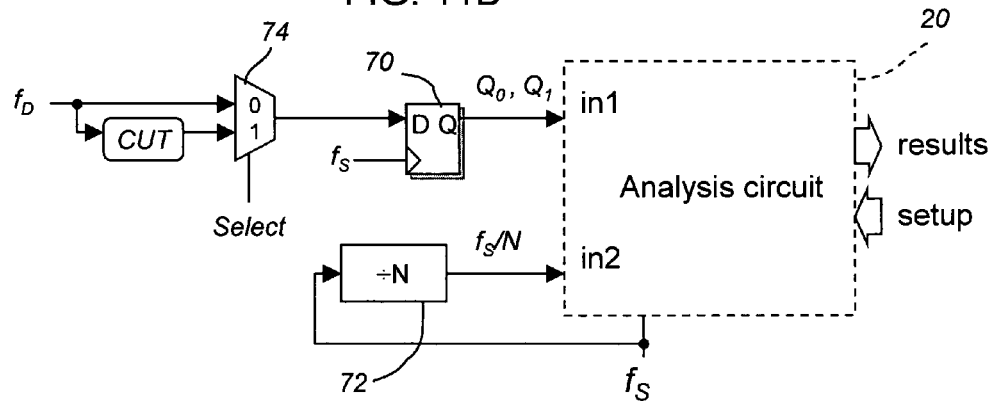
FIG. 11B is a schematic of circuit that measures time intervals in twice the time of the circuit of FIG. 11A.

FIG. 11B shows an alternative implementation that uses only one sampling flip-flop 70 connected to input in1, but it requires two measurements, each relative to a reference period of $f_S/N$ to be able to measure a delay through the CUT. Frequency divider 72 in FIG. 11B provides the clock $f_S/N$ to input in2 with some unknown but constant delay and phase (an equivalent $f_S/N$ reference frequency could also be generated, as mentioned earlier, by undersampling $f_D$). N is equal to 1/R, where R is as defined earlier.

Figure 11C:
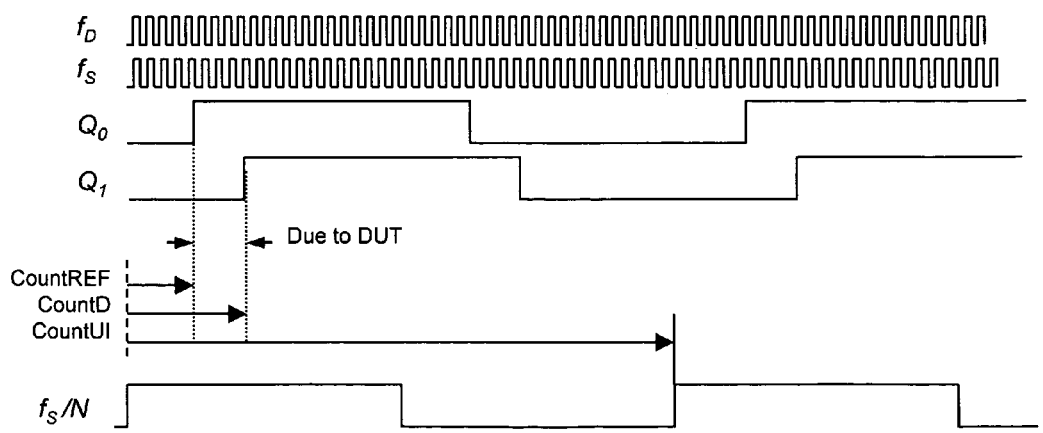
FIG. 11C shows waveforms for the circuit of FIG. 11A or FIG. 11B.

The circuit of FIG. 11B accesses the stimulus signal and the delayed stimulus signal through a multiplexer 74 connected to input in1. To perform a measurement, the CUT input signal is selected via multiplexer 74, the output of the multiplexer is sampled by latching circuit 70 clocked by $f_S$, and analysis circuit 20 measures the delay between a rising edge of the in1 signal and a rising edge of the $f_S/N$ reference clock signal. Waveforms are shown in FIG 11C. Next, the CUT output signal is accessed via the multiplexer, and the analysis circuit measures the delay between a rising edge of the in1 signal and a rising edge of the $f_S/N$ signal. The difference between the two delays is equal to the rising edge delay of the CUT. Similarly, the difference between the two counts for the falling edges can be related to the falling edge delay of the CUT. The duty cycle of either signal can also be measured as previously described.

Figure 12A:
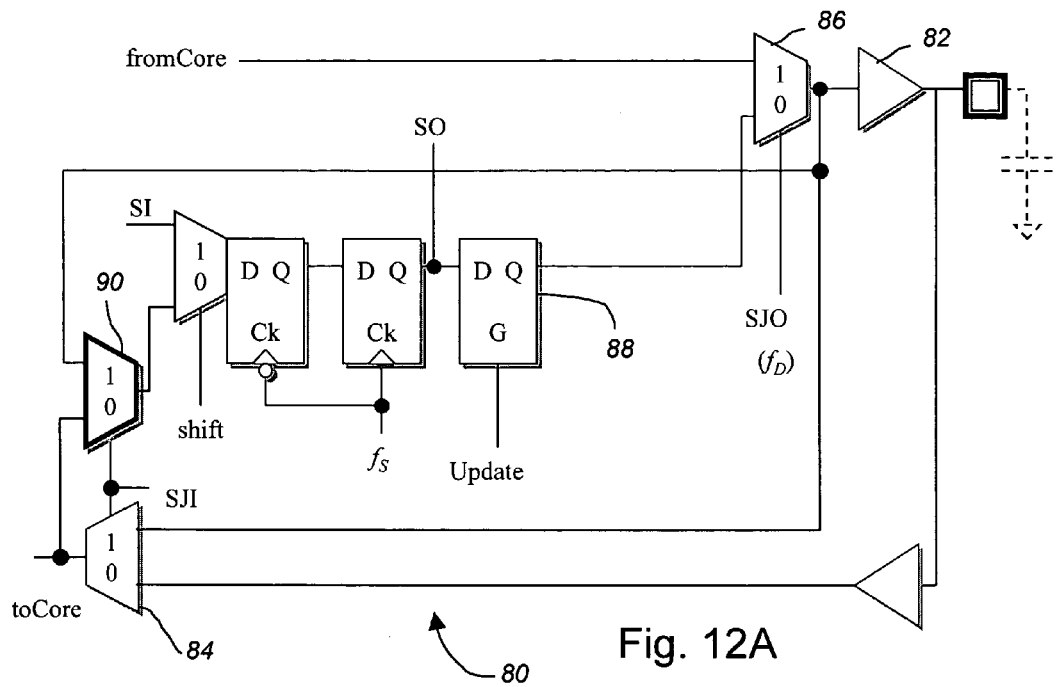
FIG. 12A, 12B, shows schematics of boundary scan cells with signal connections to $f_S$ and $f_D$ made according to an embodiment of the present invention.

The delay measurement circuit and method of the present invention can be used to measure delays of input and output circuitry that is controlled by a boundary scan register within an IC. The schematic of FIG. 12A shows a boundary scan cell 80 that is the same as a prior art circuit (IEEE 1149.1) except that its signal ports are connected according to an embodiment of the invention. The boundary scan cell is part of a boundary scan register (BSR), a shift register that controls the state of many I/O pins of an IC, preferably constructed according to the IEEE 1149.1 standard. The delay path of interest is from the input of the output pad driver 82 to the output of the input multiplexer 84 (whose output goes to the core of the IC)—in other words the two points of interest are the inputs to a multiplexer 90 (in bold outline) which corresponds to the multiplexer 74 in FIG. 11B. The stimulus signal $f_D$ is conveyed to the output driver via the output multiplexer 86. The output multiplexer selects the signal from the core of the IC or the signal from update latch 88 that contains a test mode logic value. First, if necessary, the value of the steady-state signal from the core is captured, scanned out of the IC to read its value, and then the update latch is pre-loaded with an opposite logic value. Then, the output multiplexer select signal, SJO (Select Jtag Output), is toggled by $f_D$. The multiplexer select signal is normally connected to a steady-state control signal SJO, according to the prior art, but in a test mode according to the present invention, the select signal is instead connected to a clock signal ($f_D$). The sampling is performed by the flip-flop which forms part of the BSR, which is clocked synchronously to a test clock (named TCK, if the circuit is constructed according to the 1149.1 standard). A multiplexer 90 (in bold outline) controlled by a mode signal SJI (Select Jtag Input) selects either the input to the output pad driver or the output of input multiplexer 84 (whose output goes to the core of the IC); a delay measurement is performed while this multiplexer is selecting one path and then a measurement is performed while selecting the other. The difference between the two delay measurements is equal to the delay of the path of interest. After each sampling instant, the captured data value must be shifted to the analysis circuit (not shown in FIG. 12). It is necessary to correctly time the sampling instants to perform the undersampling as previously described. The ratio of $f_D$ to the test clock frequency, $f_S$, is a non-integer as previously mentioned. According to the invention, if the ratio is (N+1)/N, where N is an integer, and the number of bits in the BSR plus the number of test access port (TAP) controller states between captures is P, then the capture instant is chosen to be a number of $f_S$ cycles equal to 1 plus a multiple of N that is larger than P.

Figure 12B:
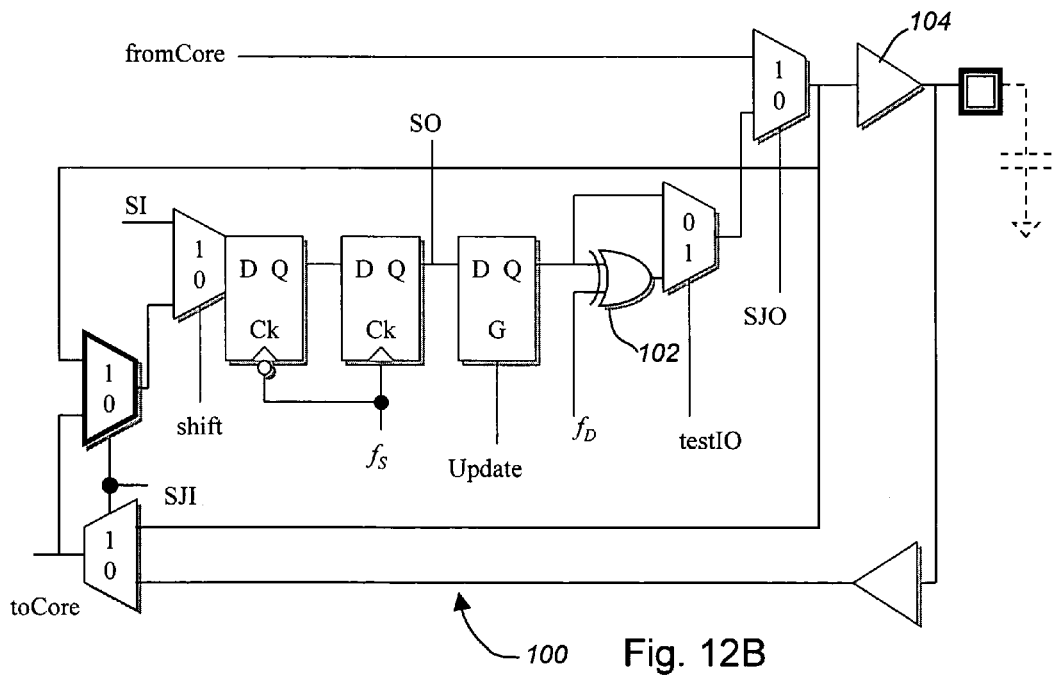

FIG. 12B shows another boundary scan cell circuit 100 that is the same as a prior art (IEEE 1149.6) except that its ports are connected according to an embodiment of the invention. In this case, an exclusive-or gate 102 is used to convey $f_D$ to the output driver 104. This circuit avoids the need to have a steady-state core signal.

The circuit of FIG. 12A can also measure the delay of interest if the signal from the functional core toggles at the $f_D$ rate by means within the Core circuit.

Other delays associated with a pin can also be measured: for example, an enable path delay can be measured by toggling the enable signal at $f_D$ rate. For this example, a pull-up resistor must be connected to the opposite logic value of the data bit used by the driver. For example, if the driver drives out logic 0 when enabled, a pull-up to logic 1 is needed. In some cases, including options of the 1149.1 standard, one signal controls the enable of all output drivers in parallel, so this signal can be toggled and no circuit modifications to the individual boundary scan cells is needed.

Figure 13A:
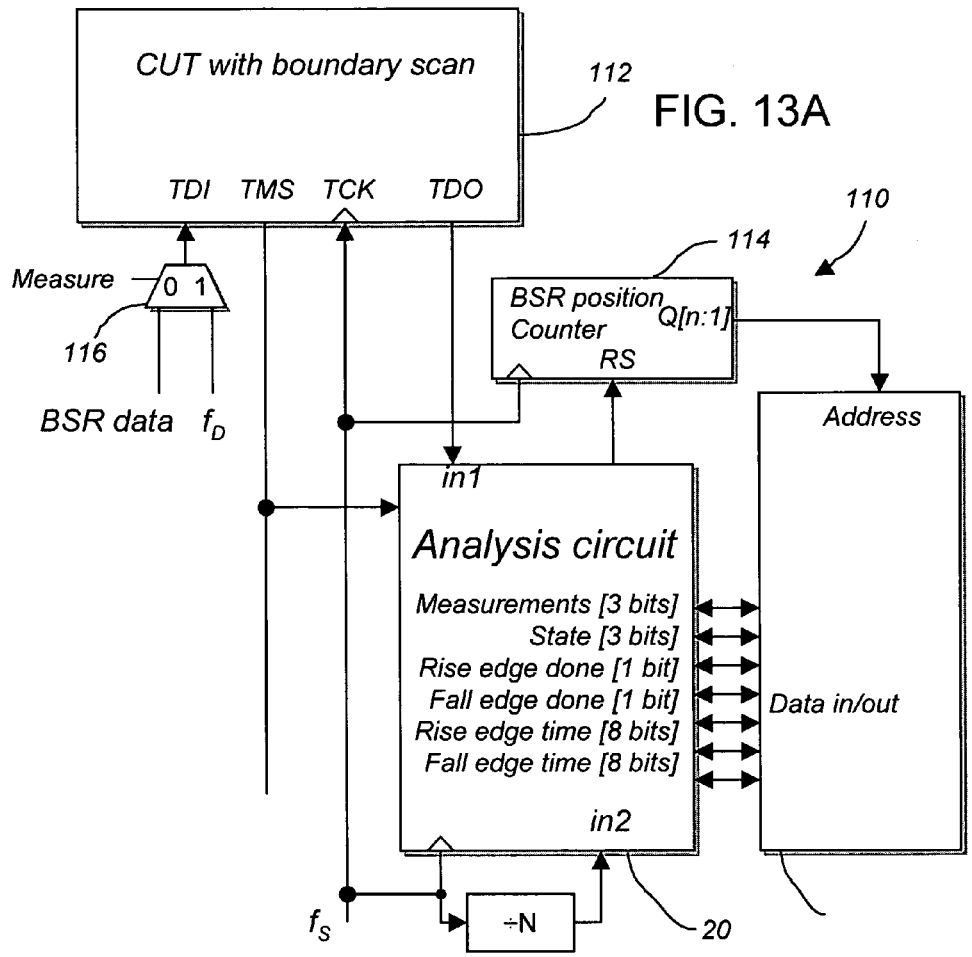
FIG. 13A, 13B, shows a schematic of a circuit under test that contains boundary scan, connected to analysis circuitry that can analyze multiple output-to-input delays simultaneously, according to an embodiment of the present invention.
Figure 13B:
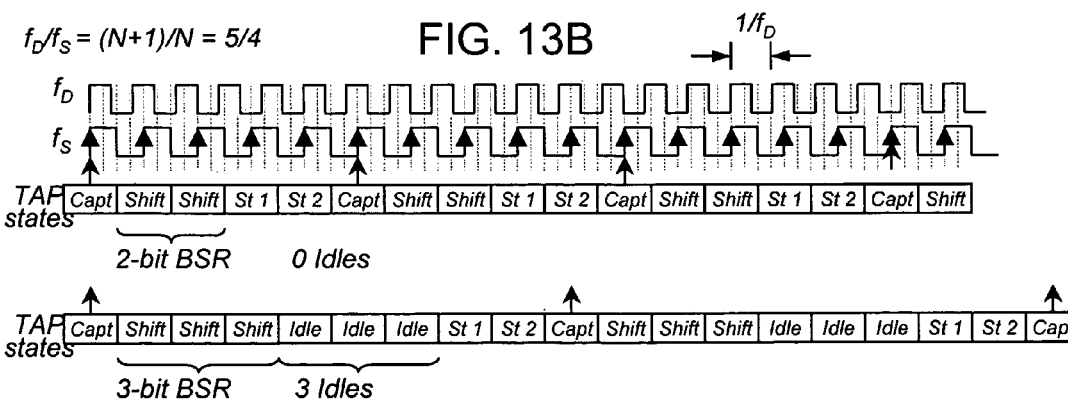

The schematic of FIG. 13A shows a circuit 110 that can simultaneously measure the I/O delays of any number of pins of an IC 112, according to an embodiment of the present invention. If the IC contains the boundary scan and TAP controller circuitry described for FIG. 12, the captured logic values can be shifted out serially and continuously analyzed for all pins simultaneously. A BSR bit position counter 114 has a maximum count equal to N+1, when $f_D/f_S=(N+1)/N$. The number of TAP controller states from one capture-DR state to the next is made equal to one plus a multiple of N by adding Idle states (Idle states are defined in 1149.1). The waveforms of FIG. 13B show an example where N=4, so the number of $f_S$ cycles between captures can be 4+1=5, or 8+1=9, etc., and the number of non-shift TAP states is 3 if the number of BSR bits is 2, and 6 if the number of BSR bits is 3 (for this simplified example, at least three TAP states are always needed between captures). A single state machine, based on the schematics of FIG. 6 and FIG. 11B, finds the delays for all pins as follows:

a) A multiplexer 116 selects BSR data for input to TDI. Values of all steady-state core output signals are captured, shifted out, and opposite data values (but not enable bits, or other control bits) are shifted into the corresponding bit positions—this step is needed for boundary scan cells like those of FIG. 12A, but not for boundary scan cells like those of FIG. 12B;

b) The TAP controller's Update output to the BSR latches is suppressed (so that no update occurs at this time); a stimulus frequency $f_D$ is applied, for example TDI is connected within the IC to the SJO inputs of FIG. 12A and the off-chip TDI multiplexer selects $f_D$; TCK is clocked at frequency $f_S$; the analysis circuit 20 initializes the BSR bit position counter 114;

c) The TAP controller is stepped continuously through its states to perform a capture-DR, then it shifts out the captured data for the BSR bits (for example, for one hundred pins there may be two hundred BSR bits), then it cycles through the TAP controller states (with update suppressed, and spending a predetermined number of cycles in Idle state), then it performs a capture-DR, then it shifts out the captured BSR bits, etc.;

d) For each $f_S$ cycle/BSR bit position count/memory address, the present state of the state machine (the contents of the registers in FIG. 6) is read from the memory, in addition to, for example, status bits that indicate which delay measurements are complete and how many measurements are complete (when they are accumulated for averaging) for the addressed pin, and the state machine is updated based on the TDO data bit (in1) combined with the $f_S/N$ reference clock signal (in2), and the new state and new status bits are written back into the same address of the memory.

After all pin measurements are complete, the measurement results are read out of the memory for each pin position.

Figure 14A:
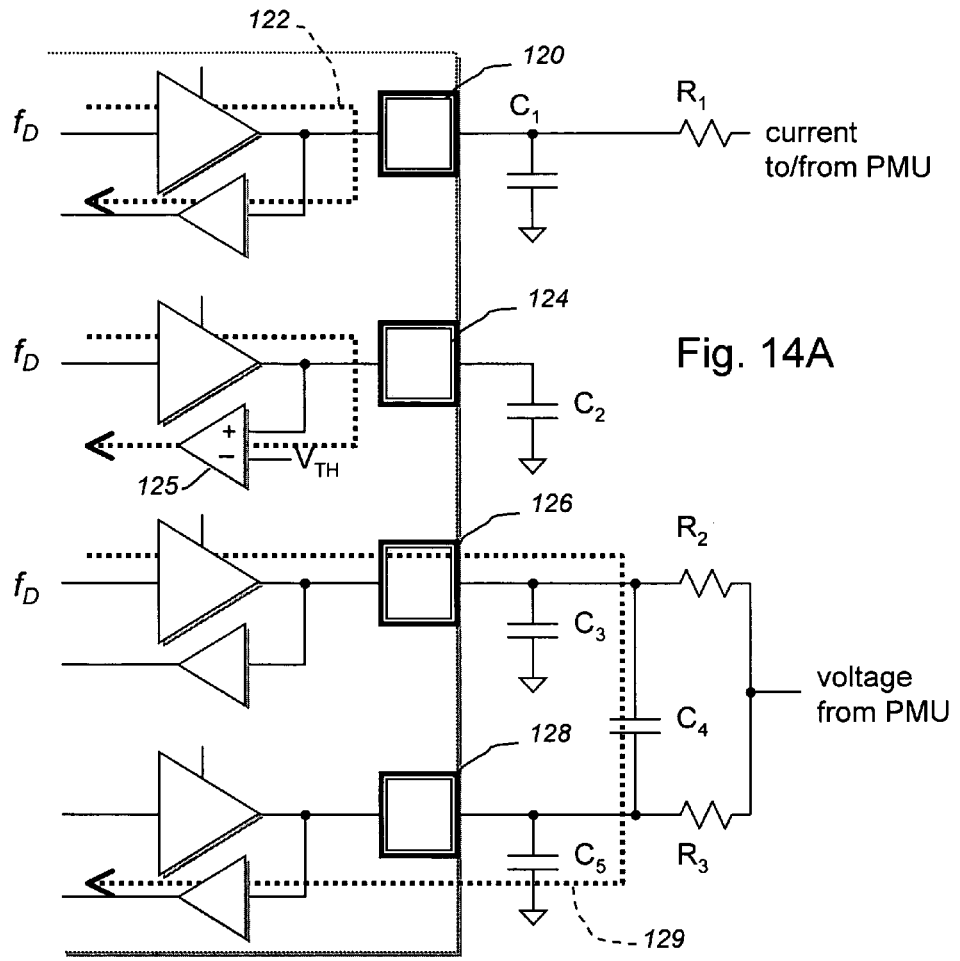
FIG. 14A, 14B, shows schematics of integrated circuit I/O pins connected to off-chip circuitry, and example waveforms, to permit measurement of transition times according to an embodiment of the present invention.

The schematic of FIG. 14A shows I/O circuits (preferably controlled by boundary scan circuits as shown in FIG. 12) that can facilitate measurement of output rise and fall transition times, according to an embodiment of the present invention.

Figure 14B:
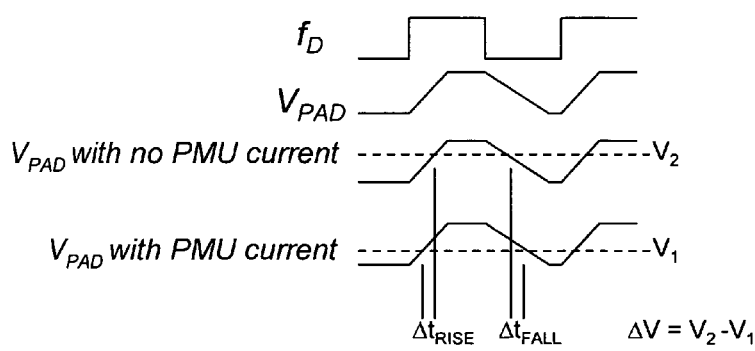

An I/O pad 120 is connected to a load capacitance $C_1$ and source of current from a tester's parametric measurement unit (PMU) via a resistor $R_1$. The capacitor $C_1$ is optional—it is added to make the transition time proportional to the output drive, in which case, the output drive can be measured instead of the unloaded rise/fall time. The resistor $R_1$ is also optional—it is added in close proximity to the pad to reduce transmission line effects when testing short transition times (transition times that are less than or comparable to the signal propagation delay along the wire to the PMU). The injected current (which can be positive or negative, and can be provided by a constant current source or a constant voltage source) has the effect of offsetting the received voltage relative to the switching point voltage of the receiver, as shown in the waveforms of FIG. 14B. The I/O delay, as indicated by the dashed arrow path 122 in FIG. 14A, is measured without and with current from the PMU. The transition time is equal to the injected voltage offset divided by the measured difference in I/O delay (delay with injected current minus delay without injected current). The injected voltage offset is equal to the voltage at the PMU minus the injected current multiplied by the resistor's resistance, measured when the output driver is driving a steady-state logic 1 or logic 0. The output drive current, if a load capacitance $C_1$ is connected and it is large enough to significantly increase the output transition time, is equal to the measured rise or fall time (minus its estimated unloaded rise or fall time) multiplied by the known load capacitance.

An I/O pad 124 is connected to a load capacitance $C_2$, which is optional as in the previous case to allow measurement of output drive. The on-chip receiver 125 is a comparator and its reference voltage $V_{TH}$ can be adjusted to change the switching point voltage of the comparator. The transition time is equal to the difference in the applied $V_{TH}$ voltages divided by the measured difference in I/O delay.

A pair of I/O pads 126 and 128 is connected to optional load capacitances $C_3$ and $C_5$, and capacitor $C_4$ is connected between the two pads. Capacitor $C_4$ provides AC-coupling, and thus allows a voltage applied to the receiver via a resistor ($R_2$ or $R_3$, depending on which I/O pad is acting as the receiver). The received signal will be attenuated by the capacitor ratio, $C_4/(C_4+C_5)$. Dashed arrow 129 indicates the delay path that can be measured when a first pad's driver is enabled and the adjacent pad's driver is disabled (tri-stated); the reverse path can be measured by disabling the first pad's driver and enabling the adjacent pad's driver. The transition time is equal to the difference in the applied PMU voltages divided by the measured difference in I/O delay, divided by the attenuation (capacitor ratio). Whether a voltage or current is needed from the PMU, it is advantageous to use a constant voltage source because a voltage source can be shared simultaneously among many pins, whereas a current source cannot.

Figure 15A:
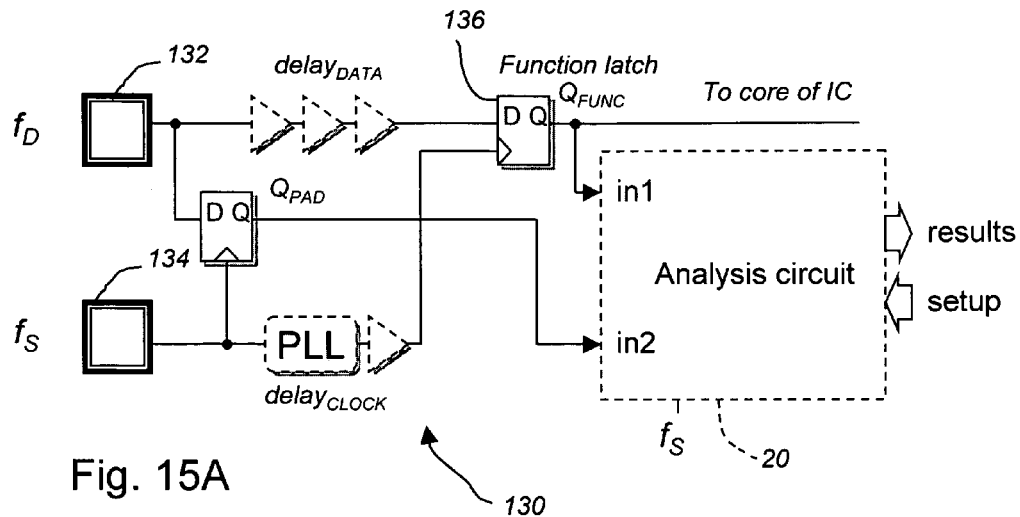
FIG. 15A, 15B, is a schematic of a circuit that measures the set-up/hold time at the pins of an IC, according to an embodiment of the present invention.
Figure 15B:
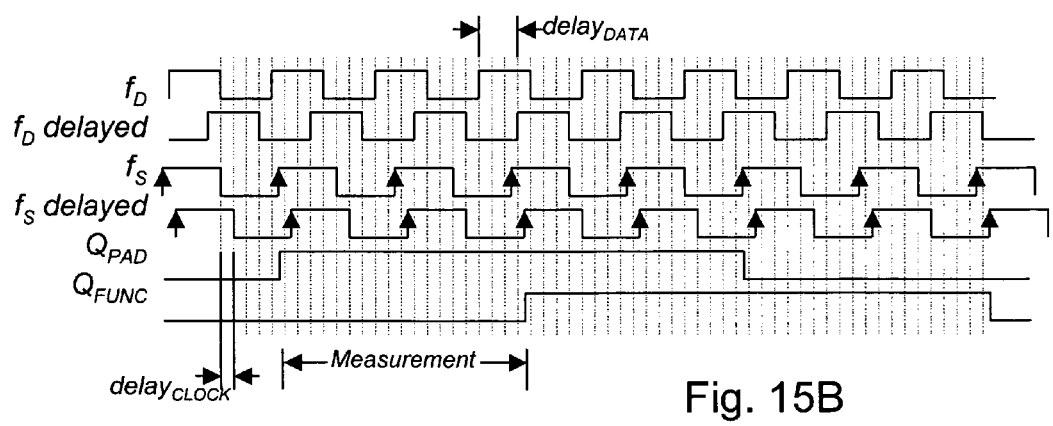

The schematic of FIG. 15A shows a circuit that can measure the setup/hold time of a data input with respect to a clock input, according to an embodiment of the present invention. In many ICs, it is required to measure the time that data must arrive at an input pin, relative to a clock input signal edge, in order for the data to be correctly latched by a function's latching circuit. The set-up time is the minimum time, in advance of the clock edge, for which the data must be valid, and the hold time is the minimum time, after the clock edge, for which the data must be held stable. These times are equal to the time at which a latched data transition would cause a metastable output due to the data arriving exactly at the time that the data is latched internal to the latch, with a timing margin added. In other words, if the median time at which the data arrival causes a latching circuit to switch from logic 1 to logic 0 (or logic 0 to logic 1) is measured, then the setup time is equal to this time minus the timing margin, and the hold time is this time plus the timing margin. The circuit 130 of FIG. 15A and corresponding waveforms in FIG. 15B compares the median time at which the data and clock rising edges are simultaneous at the pads 132 and 134 of the IC, to the median time at which the data and clock rising edges are simultaneous as perceived by function latch 136. Analysis circuit 20 performs a rising edge delay measurement, as previously described, and this delay is equal to the setup/hold time (assuming the two latches shown have equal or negligible internal setup and hold times).

The schematics of FIG. 16A, 16B show circuits that reduce the time to perform a measurement, relative to the measurement circuitry of the present invention described thus far, according to an embodiment of the invention. The latching circuit described previously is always clocked by the same edge of a sampling clock, $f_S$. For example, the latch is always clocked by the clock's rising edge. When measuring jitter of one type of edge (a rising or a falling edge, but not both) of $f_D$, or measuring a rising edge to rising edge delay, the measurement time is halved by using both edges of the sampling clock. The clock edge that activates the latching circuit is changed after each edge of the alias frequency that appears on the latch output. Specifically, the active edge is changed each time a stable logic value is detected (states 1 or 5 of the state diagram of FIG. 4B); also, if necessary, the state of the state machine may be changed to the complementary one—for example if the state machine was in state 1 (stable zero), then its state may be simultaneously changed to state 5 (stable one) when the change of active edge occurs (typically, this state change is unnecessary). Circuit 140 of FIG. 16A changes the active sampling edge by using a transparent latch 142 ahead of a primary latching circuit 144. In one mode, an Alt (alternate) signal is logic 1 which forces an or-gate 146, that clocks the transparent latch, to steady-state logic 1, which puts the transparent latch in its feedthrough (transparent) mode; the active clock edge is that of the primary latching circuit. In the other mode, when the Alt signal is low, the or-gate feeds the sampling clock to the transparent latch and when an $f_S$ falling edge occurs, the transparent latch's output is held until the next rising edge whereupon the latch is transparent until the next falling edge of $f_S$. A preferred embodiment, the circuit 150 of FIG. 16B, accomplishes the alternate edge sampling by alternately selecting one or the other output of two latching circuits 152 and 154. As shown in the waveforms of FIG. 16B, the output of a multiplexer 156 contains twice as many rising edges per long time interval compared to either of the individual latches, which means that for the same precision (variance), the measurement time can be halved relative to using just one active edge of $f_S$.

It will be understood by those skilled in the art that many other types of delays and time intervals in an IC can be measured using the present invention.

Memory write access times can be measured by using the digital memory (for example, a RAM) as the CUT, as shown in FIG. 6A, clocked by $f_S$. The memory's digital address is a periodic sequence of address values changing synchronously with $f_S$, the memory's data input is a periodic pattern clocked at frequency $f_D$, the in2 signal is the memory's data output, and the in1 signal is the data clocked at frequency $f_D$.

Memory read access times can be measured by storing a periodic pattern in the digital memory, and clocking the memory at frequency $f_D$. The memory's digital address is a periodic sequence of address values changing synchronously with $f_D$, the memory's data output is sampled at frequency $f_S$, the in2 signal is the memory's data output, and the in1 signal is clock $f_D$.

As was shown for the CDR measurements, the time interval being measured might not be a propagation delay but simply a time interval between two periodic, correlated events—signal transitions at one circuit node and signal transitions at another circuit node.

Figure 17A:
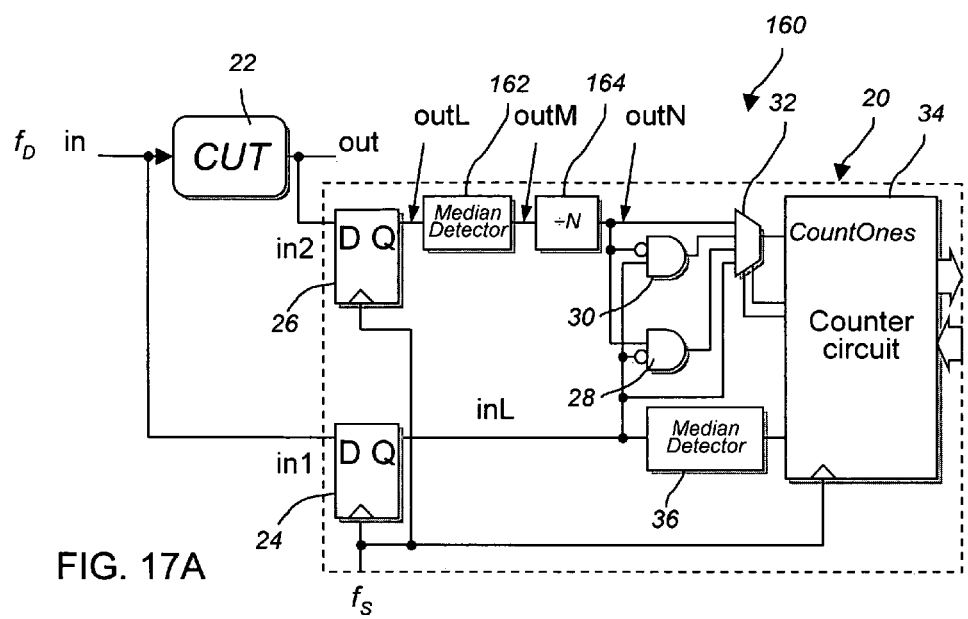
FIG. 17A, 17B, is a schematic of a circuit for measuring a time interval between an input and output of a CUT having different input and output frequencies, and example waveforms, according to an embodiment of the present invention.
Figure 17B:
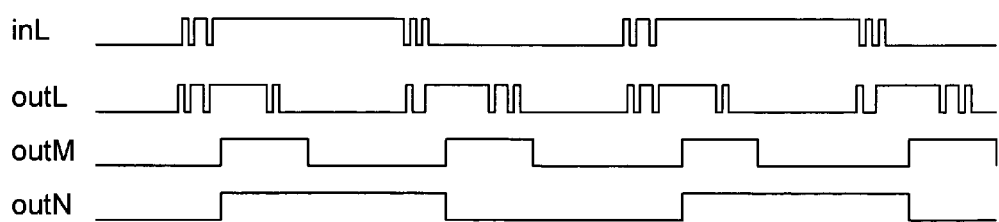

For some types of CUT, for example a PLL or a digital frequency divider, the output frequency is not equal to the input frequency; instead one is an integer multiple of the other. To measure the phase delay for this type of circuit, the circuit of FIG. 6A is not suitable because that circuit can only measure delay for waveforms having the same fundamental frequency. The output frequency of the CUT could be divided by an integer to obtain the required frequency, but such a circuit would add delay that might vary with voltage and temperature. A delay measurement circuit 160, according to an embodiment of the invention, is shown in FIG. 17A, and its corresponding waveforms are shown in FIG. 17B. Relative to the circuit of FIG. 6A, two functions are added: a (second) median detector 162 (like that in FIG. 4) and a frequency divider 164 are connected between the output of the latching circuit that latches the higher frequency and the corresponding input to the combinational logic. As shown in the FIG. 17B waveforms, the median detector eliminates the unstable bits caused by jitter, while retaining the median edge time (with an inherent predetermined delay of an integer number of $f_S$ clock cycles). The latching circuit output (outL) is not suitable for frequency dividing because of the unstable bits, but the output (outM) of the median detector is suitable for frequency division using any of a variety of simple prior art circuits (especially divide by 2, 4, 8, or any other power of 2). The predetermined delay of the median detector is subtracted from the measured delay (both in units of $f_S$ cycles) to obtain the CUT delay.

Figure 18A:
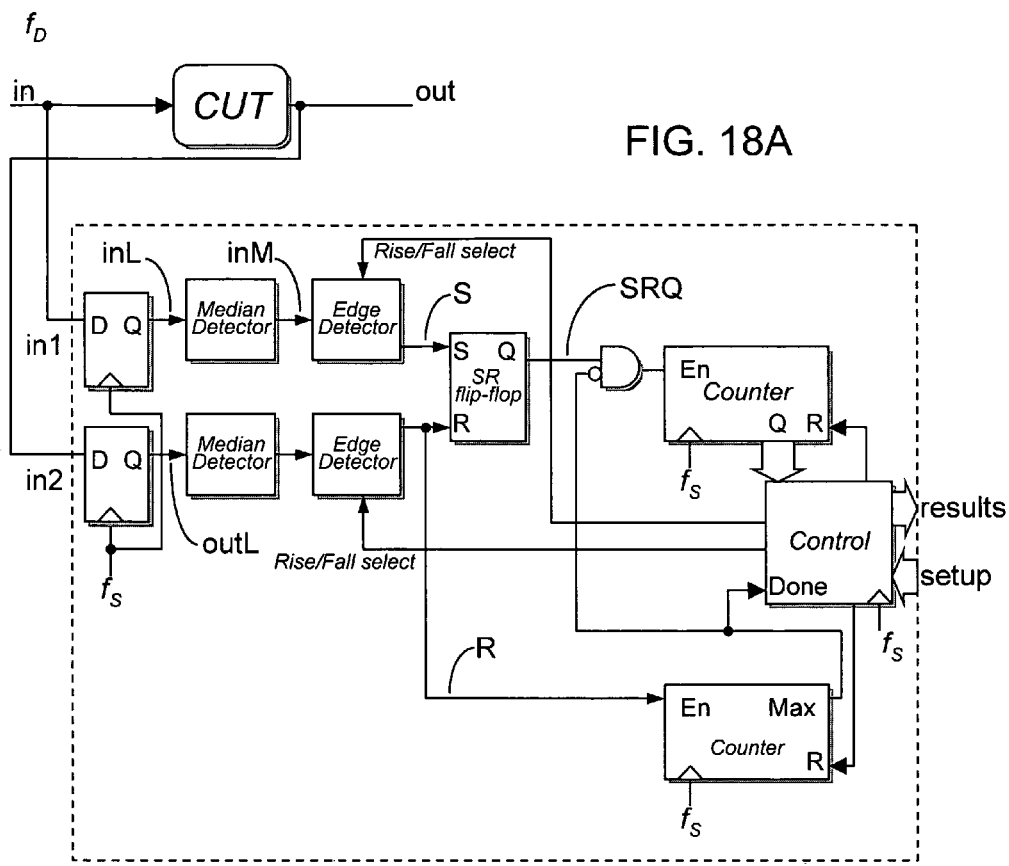
FIG. 18A is a schematic of a general purpose time interval measurement circuit, with corresponding waveforms are shown in FIG. 18B, according to a preferred embodiment of the present invention.
Figure 18B:
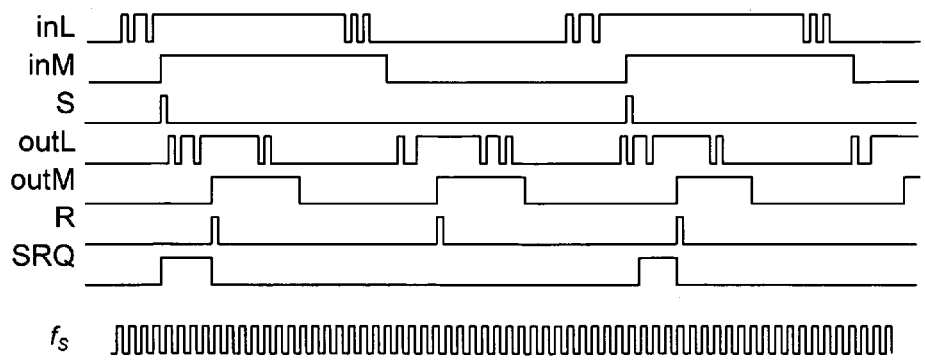

The schematic of a general purpose time interval measurement circuit 170, according to a preferred embodiment of the invention, is shown in FIG. 18A and its corresponding waveforms are shown in FIG. 18B. The output of each undersampling latch is connected to a median edge detector. The output of each median edge detector is connected to a circuit that generates a pulse for each edge of a selected type, and the pulses have a duration of, for example, one cycle of $f_S$. The edge pulses set or reset a set/reset flip-flop (synchronous or asynchronous) 178. The width of each output pulse from this flip-flop will therefore be proportional to the time interval, as shown in FIG. 18B, and will be tolerant of substantial jitter in the CUT signals and resultant unstable bits in the latched outputs.

Any of the time interval measurements can be compared to test limits, for example an upper and a lower limit, to decide whether a CUT passed as production test. Additional circuitry may be included in an IC to perform this comparison to limits stored on-chip. The limits can be hard-coded on the IC or preferably loaded into the IC during the test. The production tester can then monitor the pass/fail result of the comparison.

Although the present invention has been described in detail with regard to preferred embodiments and drawings of the invention, it will be apparent to those skilled in the art that various adaptions, modifications and alterations may be accomplished without departing from the spirit and scope of the present invention. Accordingly, it is to be understood that the accompanying drawings as set forth hereinabove are not intended to limit the breadth of the present invention, which should be inferred only from the following claims and their appropriately construed legal equivalents.

We claim:

1. A circuit for measuring a time interval between transitions of periodic signals at nodes of a circuit-under-test (CUT), the signal having a clock frequency $f_D$, and the circuit comprising:
    an input for an undersampling clock signal having a sampling frequency $f_S$, where $f_D/f_S$ is equal to K±R, K is an integer, and R is a number between zero and one;
    a first latching circuit for periodically latching a digital value of a periodic signal at a first node of said CUT and at edges of said undersampling clock signal;
    a second latching circuit for periodically latching a digital value of a periodic signal at a second node of said CUT and at edges of said undersampling clock signal, said periodic signals having the same period;
    means for combining said first and second latching circuit outputs to produce a combined output whose duty cycle is proportional to the time interval between a median edge of said first latch output and a median edge of said second latch output; and
    a counter circuit for determining an average signal propagation delay based on the number of logic ones in said combined output which occur in a predetermined time interval.

2. A circuit as defined in claim 1, wherein at least one of said periodic signals has substantial jitter and said combining means comprises combinational logic.

3. A circuit as defined in claim 1, wherein at least one of said periodic signals has substantial jitter and said combining means includes a median edge detector.

4. A circuit as defined in claim 1, said counter circuit including:
    a first counter for counting undersampling clock cycles until the count reaches a predetermined maximum number of undersampling clock cycles;
    a second counter for counting undersampling clock cycles during which said combinational output is a predetermined logic value until said first counter reaches said predetermined maximum number whereat an output count of said second counter is proportional to a time interval between a transition of said first periodic signal and a transition of said second periodic signal.

5. A circuit as defined in claim 4, wherein said predetermined maximum number of undersampling clock cycles is equal to a predetermined integer multiplied by K/R periods of the undersampling clock, and each K/R period is detected by a median edge detector connected to the output of said second latching circuit, and R is possibly variable.

6. A circuit as defined in claim 4, further including a shift register between said first latching circuit and said means for combining.

7. A circuit as defined in claim 6, said shift register including means for simultaneously latching multiple parallel inputs.

8. A circuit as defined in claim 7, further including means for storing and reloading the count of said first counter for each bit shifted out from said shift register.

9. A circuit as defined in claim 8, said circuit being operable for measuring a plurality of time intervals simultaneously.

10. A circuit as defined in claim 7, further including means to alternate a CUT signal between a stored logic value and its complement, at said clock frequency $f_D$, and means to select whether an input or an output signal of the CUT is latched.

11. A circuit as defined in claim 7, said circuit being constructed according to IEEE 1149.1 boundary scan standard.

12. A circuit as defined in claim 11, wherein a mode control signal for an output driver multiplexer is stimulated with said first periodic clock signal and a clock for said shift register is stimulated with said undersampling clock signal.

13. A circuit as defined in claim 11, in which the ratio of said first periodic signal frequency to said periodic undersampling clock signal frequency is N+1/N where N is an integer, and the number of bits in a boundary scan register plus the number of TAP controller states from one capture state to the next is K, and the capture instant is chosen to be a number of test clock cycles equal to 1 plus a multiple of N that is larger than K by adding Idle or other non-operative TAP controller states.

14. A circuit as defined in claim 7, said circuit being constructed according to IEEE 1149.6 boundary scan standard, wherein an output driver is stimulated with said first periodic clock signal and a clock for said shift register is stimulated with said undersampling clock signal.

15. A circuit as defined in claim 1, wherein each said digital value being the result of a comparison between the periodic signal's voltage and a reference voltage.

16. A circuit as defined in claim 15, further including means for adjusting the voltage difference between the average voltage of the periodic signal relative and said reference voltage.

17. A circuit as defined in claim 16, further including means for computing said time interval for a first voltage difference and for a second voltage difference, where either of said differences may be zero, and the difference between the time intervals being proportional to the transition time of said periodic signal.

18. A circuit as defined in claim 1, further including a multiplexer for selectively accessing each of a plurality of CUT nodes' signals as said first periodic signal; each corresponding time interval is relative to a transition of a delayed version of said first periodic signal; the time interval between the signals of two selected CUT nodes is equal to the difference between the time intervals measured for each node.

19. A circuit as defined in claim 1, wherein said first or second latching circuit is the CUT or a portion thereof.

20. A circuit as defined in claim 19, the CUT and said second latching circuit being a digital memory clocked at frequency $f_S$ and data applied to the memory at clock frequency $f_D$ being a CUT input.

21. A circuit as defined in claim 1, said time interval corresponding to a propagation delay.

22. A circuit as defined in claim 1, said time interval corresponding to a phase offset.

23. A circuit as defined in claim 1, said time interval corresponding to a sampling instant within a signal eye.

24. A circuit as defined in claim 1, said time interval corresponding to a delay between phases of a sampling clock.

25. A circuit as defined in claim 1, said time interval corresponding to a setup and hold time for a latching circuit of the CUT.

26. A circuit as defined in claim 1, further including a load impedance connected to a CUT node, and the load impedance value is chosen to significantly affect the transition time of the driver's output signal.

27. A circuit as defined in claim 1, further including circuitry for alternating an active clock edge for the latching circuit between rising edge and falling edge, where the alternate edge is selected once each time the output of the latching circuit is detected as being stable.

28. A circuit as defined in claim 1, the CUT being a digital memory clocked at frequency $f_D$ and said clock $f_D$ being a CUT input.

29. A circuit as defined in claim 1, further including a median detector and frequency divider connected between the output of at least one of said latching circuits and the corresponding input to said combinational logic.

30. A method for measuring a time interval between transitions of periodic signals at nodes of a circuit-under-test (CUT), the signals having a periodic clock frequency, comprising:

periodically latching a digital value of a first periodic signal at edges of an undersampling clock in which the ratio of the undersampling clock frequency to the periodic clock frequency is equal to K±R, where K is an integer, and R is a number between zero and one;

simultaneously periodically latching a digital value of a second periodic signal at edges of the undersampling clock, the second periodic signal having the same period as the first periodic signal;

combining latched digital values of said first periodic signal and latched digital values of said second periodic signal to produce a combined output whose duty cycle is proportional to the time interval between a median edge of latched digital values of said first periodic signal and a median edge of latched digital values of said second periodic signal; and counting the number of undersampling clock cycles in which the combined output is a predetermined logic value within a predetermined time interval whereat said number is proportional to a time interval between a transition of said first periodic signal and a transition of said second periodic signal.

31. A method as defined in claim 30, wherein the time interval corresponds to one of a sampling instant within a signal eye, a phase offset, a delay between phases of a sampling clock, a setup and hold time, a jitter tolerance, a write access time, and a read access time.

32. A method as defined in claim 30, further including detecting a median edge time of at least one of said latched digital values and digitally dividing the resultant signal frequency by an integer prior to said logical combining.

33. A method as defined in claim 30, further including detecting a median edge time of at least one of said latched digital values.

\* \* \* \* \*